(12) United States Patent
Worm

(10) Patent No.: US 6,619,304 B2
(45) Date of Patent: Sep. 16, 2003

(54) PRESSURE CHAMBER ASSEMBLY INCLUDING NON-MECHANICAL DRIVE MEANS

(75) Inventor: Steven Lee Worm, Raleigh, NC (US)

(73) Assignee: MiCell Technologies, Inc., Raleigh, NC (US)

( * ) Notice: Subject to any disclaimer, the term of this patent is extended or adjusted under 35 U.S.C. 154(b) by 0 days.

(21) Appl. No.: 09/951,355

(22) Filed: Sep. 13, 2001

(65) Prior Publication Data

US 2003/0047202 A1 Mar. 13, 2003

(51) Int. Cl.⁷ .................................................. B08B 3/04
(52) U.S. Cl. ....................... 134/140; 134/147; 134/157; 310/46
(58) Field of Search ............................ 134/2, 33, 140, 134/147, 157; 118/500, 730; 211/41.17, 41.18; 310/46

(56) References Cited

U.S. PATENT DOCUMENTS

| | | | |
|---|---|---|---|
| 4,106,825 A | 8/1978 | Ruyak | 308/139 |
| 5,324,540 A * | 6/1994 | Terada | 427/255.5 |
| 5,482,564 A | 1/1996 | Douglas et al. | 134/18 |
| 5,494,526 A | 2/1996 | Paranjpe | 134/1 |
| 5,514,220 A | 5/1996 | Wetmore et al. | 134/22.18 |
| 5,522,938 A | 6/1996 | O'Brien | 134/1 |
| 5,700,379 A | 12/1997 | Biebl | 216/2 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,922,833 A | 7/1999 | DeSimone et al. | 528/490 |
| 5,944,996 A | 8/1999 | DeSimone et al. | 210/634 |
| 5,976,264 A | 11/1999 | McCullough et al. | 134/2 |
| 5,982,986 A * | 11/1999 | Davenport | 392/418 |
| 6,001,418 A | 12/1999 | DeSimone et al. | 427/240 |
| 6,022,413 A * | 2/2000 | Shinozaki et al. | 118/715 |
| 6,024,801 A | 2/2000 | Wallace et al. | 134/1 |

(List continued on next page.)

FOREIGN PATENT DOCUMENTS

| | | | |
|---|---|---|---|
| EP | 0 681 317 A2 | 11/1995 | |
| EP | 0 725 427 A2 | 8/1996 | |
| WO | WO 92/05922 A1 | 4/1992 | |
| WO | WO01/33613 | 5/2001 | H01L/21/00 |
| WO | WO01/33615 | 5/2001 | H01L/21/00 |
| WO | WO01/46999 | 6/2001 | H01L/21/00 |

OTHER PUBLICATIONS

International Search Report, PCT/US02/24004, Dec. 12, 2002.

Bok, E. et al. Supercritical Fluids for Single Wafer Cleaning, *Solid State Technology*, pp. 117–120 (1992).

(List continued on next page.)

*Primary Examiner*—Randy Gulakowski
*Assistant Examiner*—Joseph Perrin
(74) *Attorney, Agent, or Firm*—Myers Bigel Sibley & Sajovec

(57) ABSTRACT

A pressure chamber assembly for processing a substrate includes a pressure vessel defining an enclosed pressure chamber. A substrate holder is disposed in the pressure chamber and is adapted to hold the substrate. A drive assembly is operable to move the substrate holder. The drive assembly includes a first drive member connected to the substrate holder for movement therewith relative to the pressure vessel and a second drive member fluidly isolated from the first drive member and the pressure chamber. A drive unit is operable to move the second drive member. The drive unit is fluidly isolated from the first drive member and the pressure chamber. The second drive member is non-mechanically coupled to the first drive member such that the drive unit can move the substrate holder via the first and second drive members.

42 Claims, 23 Drawing Sheets

U.S. PATENT DOCUMENTS

| | | | | |
|---|---|---|---|---|
| 6,030,663 | A | 2/2000 | McClain et al. | 427/389.9 |
| 6,067,728 | A | 5/2000 | Farmer et al. | 34/470 |
| 6,149,828 | A | 11/2000 | Vaartstra | 216/57 |
| 6,181,040 | B1 * | 1/2001 | Schob | 310/90.5 |
| 6,235,121 | B1 * | 5/2001 | Honma et al. | 118/730 |
| 6,240,936 | B1 | 6/2001 | DeSimone et al. | 134/33 |
| 6,242,165 | B1 | 6/2001 | Vaartstra | 430/329 |
| 6,277,753 | B1 | 8/2001 | Mullee et al. | 438/692 |
| 6,412,503 | B1 * | 7/2002 | Lerner et al. | 134/157 |

OTHER PUBLICATIONS

Rubin, J.B. et al. A Comparison of Chilled DI Water/Ozone and $CO_2$–Based Supercritical Fluids as Replacements for Photoresist–Stripping Solvents, *IEEE/CPMT Int'l Electronics Manufacturing Technology Symposium*, 308–314 (1998).

Sarbu, T. et al. Non–fluorous Polymers with Very High Solubility in Supercritical $CO_2$ Down to Low Pressures, *Nature*, 405:165–168 (2000).

Biberger, M.A. et al. Photoresist and Photoresist Residue Removal with Supercritical $CO_2$, *Semiconductor Fabtech* $12^{th}$ Edition, pp. 239–243.

Jafri, I. Et al. Critical Point Drying and Cleaning for MEMS Technology, *SPIE*, vol. 3880, pp. 51–58 (1999).

Dyck, C.W. et al. Supercritical Carbon Dioxide Solvent Extraction from Surface–Micromachined Micromechanical Dtructures, *SPIE Micromachining and Microfabrication*, Oct. (1996).

Wang, C.W. et al. Supercritical $CO_2$ Fluid for Chip Resistor Cleaning, *Journal of the Electrochemical Society*, vol. 146, pp. 3485–3488 (1999).

Chitanvis, S.M. et al. Dynamics of Particle Removal by Supercritical Carbon Dioxide, Chapter 4, pp. 70–86, from *Supercritical fluid cleaning : fundamentals, technology, and applications* (edited by McHardy and Sawan) (1998).

U.S. patent application Ser. No. 09/816,956, filed Mar. 23, 2001.

* cited by examiner

US 6,619,304 B2

PRESSURE CHAMBER ASSEMBLY INCLUDING NON-MECHANICAL DRIVE MEANS

FIELD OF THE INVENTION

The present invention relates to pressure chambers and, more particularly, to a pressure chamber assembly including drive means.

BACKGROUND OF THE INVENTION

Integrated circuits (ICs), optoelectronic devices, micromechanical devices and other precision fabrications are commonly formed using thin films applied to substrates. As part of the fabrication process, it is often necessary to remove or clean a portion or all of the thin film from the substrate. For example, in the manufacture of semiconductor wafers including ICs, a thin photoresist layer may be applied to the semiconductor substrate and subsequently removed.

Contaminants removed from surface features of microelectronic substrates after various manufacturing steps (e.g., after post-ion implant, 'back end of the line' (BEOL) cleans, 'front end of the line' (FEOL) cleans, and post chemical mechanical planarization (CMP) steps) vary in nature and composition dramatically. Accordingly, cleaning and treating steps must address these contaminants with the appropriate chemistries and solvents to either react with, ionize, dissolve, swell, disperse, emulsify, or vaporize them from the substrate. As such, a variety of water and solvent-based systems, and dry cleaning processes have been developed to address the broad variety of waste materials.

SUMMARY OF THE INVENTION

According to method embodiments of the present invention, a method for cleaning a microelectronic substrate includes placing the substrate in a pressure chamber. A process fluid including dense phase $CO_2$ is circulated through the chamber such that the process fluid contacts the substrate. The phase of the $CO_2$ is cyclically modulated during at least a portion of the step of circulating the process fluid.

According to further method embodiments of the present invention, a method for cleaning a microelectronic substrate includes placing the substrate in a pressure chamber. A process fluid including dense phase $CO_2$ is sprayed onto the substrate in a chamber. The phase of the $CO_2$ is cyclically modulated during at least a portion of the step of spraying the process fluid.

According to further method embodiments of the present invention, a method for cleaning a microelectronic substrate includes providing the substrate in a pressure chamber containing a process fluid including dense phase $CO_2$ such that the substrate is exposed to the $CO_2$. The phase of the $CO_2$ is cyclically modulated by alternating $CO_2$ mass flow between a supply of $CO_2$ and the chamber and between the chamber and a low pressure source. The supply of $CO_2$ is at a higher pressure than the chamber and the low pressure source is at a lower pressure than the chamber.

According to further method embodiments of the present invention, a method for cleaning a microelectronic substrate includes placing the substrate in a pressure chamber. A process fluid including dense phase $CO_2$ is introduced into the chamber such that the process fluid contacts the substrate to thereby clean the substrate. A portion of the process fluid is removed from the chamber. The portion of the process fluid is re-introduced into the chamber.

According to further method embodiments of the present invention, a method for cleaning a microelectronic substrate includes placing the substrate in a pressure chamber. A process fluid including dense phase $CO_2$ is introduced into the chamber such that the process fluid contacts the substrate to thereby clean the substrate. A portion of the process fluid is removed from the chamber. The portion of the process fluid removed from the chamber is distilled to separate $CO_2$ from other components of the process fluid. The separated $CO_2$ is re-introduced into the chamber.

According to further method embodiments of the present invention, a method for cleaning a microelectronic substrate includes cleaning a substrate in a process chamber using a process fluid including $CO_2$. The used process fluid is removed from the process chamber. $CO_2$ is separated from the used process fluid. The separated $CO_2$ is reused in the process chamber or a further process chamber.

According to embodiments of the present invention, an apparatus for cleaning a microelectronic substrate includes a pressure chamber and means for circulating a process fluid including dense phase $CO_2$ through the chamber such that the process fluid contacts the substrate. The apparatus further includes means for modulating the phase of the $CO_2$ while the process fluid is being circulated.

According to further embodiments of the present invention, an apparatus for cleaning a microelectronic substrate using a process fluid including dense phase $CO_2$ includes a pressure chamber. A spray member is operative to spray the process fluid onto the substrate in the chamber. The apparatus further includes means for cyclically modulating the phase of the $CO_2$.

According to embodiments of the present invention, an apparatus for cleaning a microelectronic substrate includes a pressure chamber containing a process fluid including dense phase $CO_2$. A supply of $CO_2$ is fluidly connectable to the chamber. The supply of $CO_2$ is at a higher pressure than the chamber. A low pressure source is fluidly connectable to the chamber. The low pressure source is at a lower pressure than the chamber. Fluid control devices are operable to cyclically modulate the phase of the $CO_2$ in the chamber by alternating $CO_2$ mass flow between the supply of $CO_2$ and the chamber and between the chamber and the low pressure source.

According to embodiments of the present invention, an apparatus for cleaning a microelectronic substrate includes a pressure chamber and a supply of a process fluid including dense phase $CO_2$ fluidly connected to the chamber. A distilling system includes a still fluidly connected to the chamber and operative to separate $CO_2$ from the process fluid. The distilling system is operative to re-introduce the separated $CO_2$ into the chamber or a further chamber.

According to embodiments of the present invention, an apparatus for cleaning a microelectronic substrate includes a process chamber containing a process fluid including $CO_2$ and means for removing used process fluid from the process chamber. The apparatus further includes means for separating $CO_2$ from the used process fluid and means for returning the separated $CO_2$ to the process chamber or a further process chamber for subsequent use.

According to embodiments of the present invention, a process chamber assembly for use with a substrate includes a vessel and a substrate holder. The vessel defines a chamber. The substrate holder has a rotational axis and includes front and rear opposed surfaces. The front surface is adapted to support the substrate. At least one impeller vane extends rearwardly from the rear surface and radially with respect to the rotational axis. The impeller vane is operative to generate a pressure differential tending to hold the substrate to the substrate holder when the substrate holder is rotated about the rotational axis. Preferably, the process chamber assembly includes a plurality of the impeller vanes extending rearwardly from the rear surface and radially with respect to the rotational axis.

According to further embodiments of the present invention, a substrate holder for use with a substrate has a rotational axis and further includes front and rear opposed surfaces. The front surface is adapted to support the substrate. At least one impeller vane extends rearwardly from the rear surface and radially with respect to the rotational axis. The impeller vane is operative to generate a pressure differential tending to hold the substrate to the substrate holder when the substrate holder is rotated about the rotational axis. Preferably, the substrate holder includes a plurality of the impeller vanes extending rearwardly from the rear surface and radially with respect to the rotational axis.

According to method embodiments of the present invention, a method for rotating a substrate holder about a rotational axis includes providing a substrate holder. The substrate holder includes front and rear opposed surfaces. The front surface is adapted to support the substrate. At least one impeller vane extends rearwardly from the rear surface and radially with respect to the rotational axis. The substrate holder is rotated about the rotational axis such that the impeller vane generates a pressure differential tending to hold the substrate to the substrate holder.

According to embodiments of the present invention, a pressure chamber assembly for use with a substrate includes a vessel and a substrate holder assembly. The vessel defines a pressure chamber. The substrate holder assembly includes a substrate holder disposed in the pressure chamber, the substrate holder including a front surface adapted to support the substrate, and a housing defining a secondary chamber. At least one connecting passage provides fluid communication between the front surface of the substrate holder and the secondary chamber. The connecting passage is adapted to be covered by the substrate when the substrate is mounted on the front surface of the substrate holder. A passive low pressure source is fluidly connected to the secondary chamber.

According to further embodiments of the present invention, a pressure chamber assembly for use with a substrate includes a vessel and a substrate holder assembly. The vessel defines a pressure chamber. The substrate holder assembly includes a substrate holder disposed in the pressure chamber, the substrate holder including a front surface adapted to support the substrate, and a housing defining a secondary chamber. A restrictive passage provides fluid communication between the pressure chamber and the secondary chamber. At least one connecting passage provides fluid communication between the front surface of the substrate holder and the secondary chamber. The connecting passage is adapted to be covered by the substrate when the substrate is mounted on the front surface of the substrate holder. A low pressure source is fluidly connected to the secondary chamber.

According to method embodiments of the present invention, a method for holding a substrate to a substrate holder in a pressure chamber includes providing a first pressure in the pressure chamber. A substrate holder assembly is provided including a substrate holder disposed in the pressure chamber, the substrate holder including a front surface adapted to support the substrate, and a housing defining a secondary chamber. At least one connecting passage provides fluid communication between the front surface of the substrate holder and the secondary chamber. The substrate is mounted on the substrate holder such that the substrate covers the connecting passage. A second pressure is provided in the secondary chamber that is lower than the first pressure using a passive low pressure source.

According to further method embodiments of the present invention, a method for holding a substrate to a substrate holder in a pressure chamber includes providing a first pressure in the pressure chamber. A substrate holder assembly is provided including a substrate holder disposed in the pressure chamber, the substrate holder including a front surface adapted to support the substrate, and a housing defining a secondary chamber. A restrictive passage provides fluid communication between the pressure chamber and the secondary chamber. At least one connecting passage provides fluid communication between the front surface of the substrate holder and the secondary chamber. The substrate is mounted on the substrate holder such that the substrate covers the connecting passage. A second pressure is provided in the secondary chamber that is lower than the first pressure.

According to embodiments of the present invention, a pressure chamber assembly for retaining a fluid includes first and second relatively separable casings defining an enclosed chamber and a fluid leak path extending from the chamber to an exterior region. An inner seal member is disposed along the leak path to restrict flow of fluid from the chamber to the exterior region. An outer seal member is disposed along the leak path between the inner seal member and the exterior region to restrict flow of fluid from the chamber to the exterior region. The inner seal member is a cup seal.

According to further embodiments of the present invention, a pressure chamber assembly for retaining a fluid includes first and second relatively separable casings defining an enclosed chamber and a fluid leak path extending from the chamber to an exterior region. An inner seal member is disposed along the leak path to restrict flow of fluid from the chamber to the exterior region. An outer seal member is disposed along the leak path between the inner seal member and the exterior region to restrict flow of fluid from the chamber to the exterior region. The inner seal member is a cup seal. The inner seal member is adapted to restrict flow of fluid from the chamber to the exterior region when a pressure in the chamber exceeds a pressure of the exterior region. The outer seal member is adapted to restrict flow of fluid from the exterior region to the chamber when a pressure in the chamber is less than a pressure of the exterior region.

According to embodiments of the present invention, a pressure chamber assembly for processing a substrate includes a pressure vessel defining an enclosed pressure chamber. A substrate holder is disposed in the pressure chamber and is adapted to hold the substrate. A drive assembly is operable to move the substrate holder. The drive assembly includes a first drive member connected to the substrate holder for movement therewith relative to the pressure vessel and a second drive member fluidly isolated from the first drive member and the pressure chamber. A drive unit is operable to move the second drive member. The drive unit is fluidly isolated from the first drive member and the pressure chamber. The second drive member is non-mechanically coupled to the first drive member such that the drive unit can move the substrate holder via the first and second drive members.

According to further embodiments of the present invention, a pressure chamber assembly for processing a substrate includes a pressure vessel defining an enclosed pressure chamber. A substrate holder is disposed in the pressure chamber and is adapted to hold the substrate. A magnetic drive assembly is operable to move the substrate holder relative to the pressure vessel.

According to further embodiments of the present invention, a pressure chamber assembly for processing a substrate includes a pressure vessel defining an enclosed pressure chamber and an exterior opening in fluid communication with the pressure chamber. A substrate holder is disposed in the pressure chamber and is adapted to hold the substrate. A drive assembly is operable to move the substrate holder relative to the pressure vessel, the drive assembly including a housing covering the exterior opening of the pressure chamber so as to seal the exterior opening.

According to embodiments of the present invention, a pressure chamber assembly includes a pressure vessel and a guard heater assembly. The pressure vessel defines an enclosed chamber. The guard heater assembly includes a guard heater disposed in the chamber and interposed between a surrounding portion of the pressure vessel and a holding volume. The guard heater is adapted to control a temperature of the holding volume. The guard heater is insulated from the surrounding portion of the pressure vessel.

According to some embodiments of the present invention, the guard heater and the surrounding portion of the pressure vessel define an insulating gap therebetween. Preferably, the insulating gap has a width of at least 0.1 mm.

According to some embodiments of the present invention, the guard heater assembly includes a layer of insulating material disposed between the guard heater and the surrounding portion of the pressure vessel. Preferably, the layer of insulating material has a thickness of at least 0.1 mm.

The guard heater assembly may further include a second guard heater disposed in the chamber and interposed between a second surrounding portion of the pressure vessel and the holding volume. The second guard heater is adapted to control the temperature of the holding volume. The second guard heater is insulated from the second surrounding portion of the pressure vessel.

A fluid spray bar may be mounted in the guard heater. A substrate holder may be disposed in the holding volume.

According to embodiments of the present invention, a process chamber assembly for use with a substrate and a flow of process fluid includes a vessel and a spray member. The vessel defines a chamber. The spray member includes at least one spray port formed therein adapted to distribute the flow of process fluid onto the substrate in the chamber. The spray member is operative to rotate about a rotational axis relative to the vessel responsive to a flow of the process fluid out of the spray member through the at least one spray port.

The spray member may include a distribution portion including a distribution channel therein, the at least one spray port extending from the distribution channel to exteriorly of the spray member.

The at least one spray port may extend at an angle with respect to the rotational axis. Preferably, the at least one spray port extends at an angle of between about 5 and 85 degrees with respect to the rotational axis.

The process chamber assembly may include a plurality of the spray ports formed in the spray member.

A bearing may be interposed between the spray member and the vessel to allow relative rotation between the spray member and the vessel.

According to further embodiments of the present invention, a spray member for distributing a flow of process fluid onto a substrate includes a spray member including at least one spray port formed therein adapted to distribute the flow of process fluid onto the substrate in the chamber. The spray member is operative to rotate about a rotational axis responsive to a flow of the process fluid out of the spray member through the at least one spray port.

The spray member may include a distribution channel therein, the at least one spray port extending from the distribution channel to exteriorly of the spray member.

The at least one spray port may extend at an angle with respect to the rotational axis. Preferably, the at least one spray port extends at an angle of between about 5 and 85 degrees with respect to the rotational axis.

The spray member may include a plurality of the spray ports formed in the spray member.

The spray member may include a bar-shaped distribution portion, the at least one spray port being formed in the distribution portion. Alternatively, the spray member may include a disk-shaped distribution portion, the at least one spray port being formed in the distribution portion.

According to method embodiments of the present invention, a method of applying a process fluid to a substrate includes placing the substrate in a chamber of a vessel. A spray member is provided including at least one spray port formed therein. The process fluid is distributed from the at least one spray port onto the substrate. The spray member is rotated about a rotational axis relative to the vessel by flowing the process fluid out of the spray member through the at least one spray port.

Objects of the present invention will be appreciated by those of ordinary skill in the art from a reading of the figures and the detailed description of the preferred embodiments that follow, such description being merely illustrative of the present invention.

DETAILED DESCRIPTION OF THE PREFERRED EMBODIMENTS

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The present invention relates generally to, inter alia, the cleaning or treating of microelectronic substrates (such as semiconductor substrates) during or subsequent to the manufacturing of integrated circuits, microelectronic devices, MEM's, MEOM's and opto-electronic devices. Removal of surface contaminants and particulates is a key step in the integrated circuit fabrication process. There are numerous cleaning steps (commonly referred to as "cleans") in the fabrication process. The different types of cleans include pre-diffusion cleans, front end of the line post-ash cleans, back end of the line post-etch cleans, pre-metal deposition cleans, front end of the line plasma strip, back end of the line clean/strip, post-ion implantation cleans and post-chemical mechanical planarization (CMP) cleans. There are many types and sources of particulates and contaminants in the fabrication process. The particles and contaminants may be molecular, ionic, atomic or gaseous in nature. The source may be inherent (e.g., redeposition of resist) or extrinsic to the process (e.g., wafer transport).

The shift of interconnect systems shift from $Al/SiO_2$ to Cu/low-k presents new challenges that may be effectively addressed using the methods and apparatus of the present invention. For example, a primary problem with the transition to Cu is the tendency of Cu to corrode when exposed to an oxidizing environment, because Cu does not have the self-passivating properties of Al. Corrosion of Cu during cleans of dual damascene structures can result in high contact resistance, undercutting and lift-off of the dielectric layers, thereby reducing circuit yields. Additional concerns have focused on the chemical compatibility of traditional cleans with low-k materials. As an example, it has been demonstrated that amine chemistries gas from OSG and other inorganic spin-on dielectric films, causes via poisoning. Aspects of the present invention may address the currently challenging cleans of these new interconnect systems.

Figure 1:
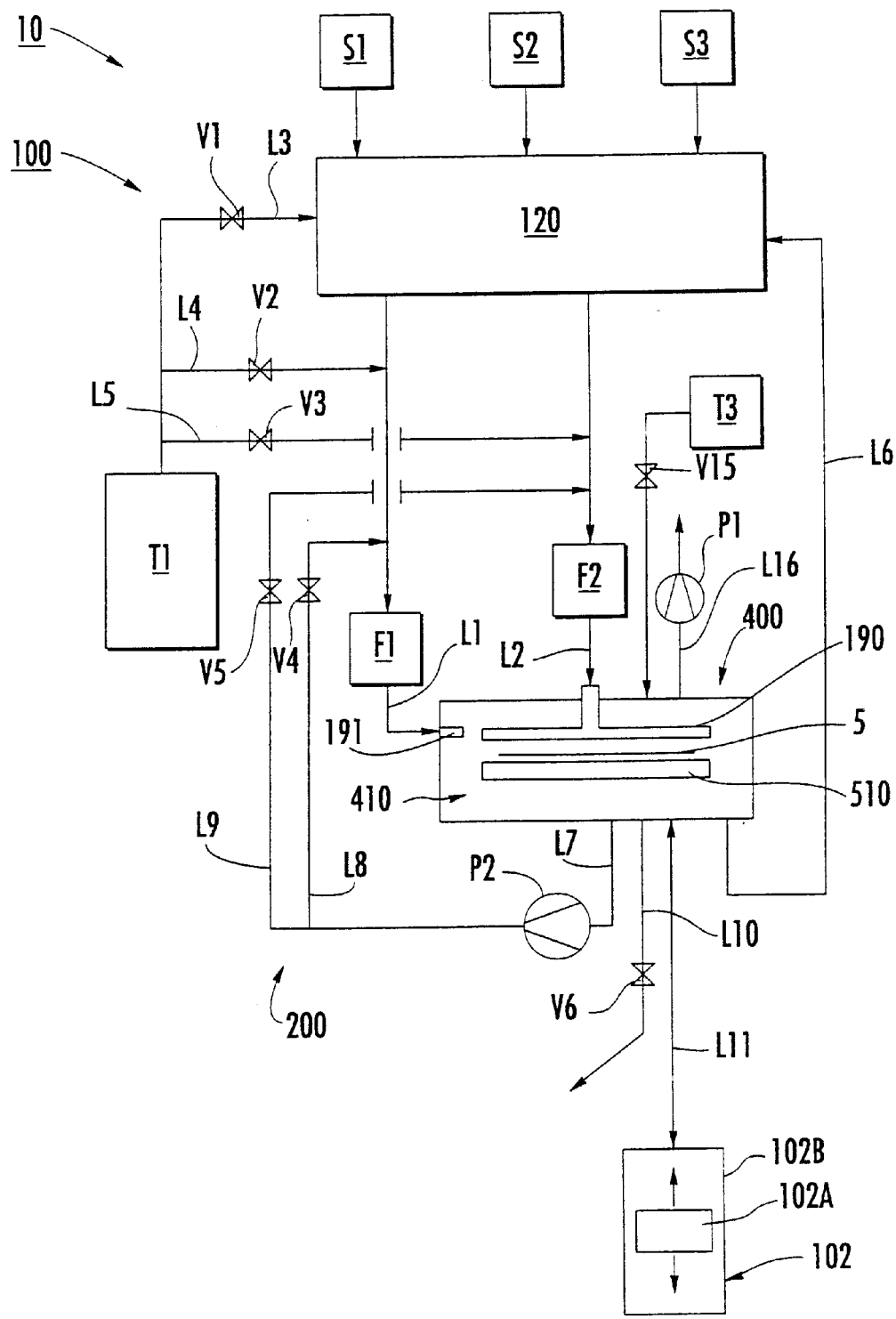
FIG. 1 is a block diagram of an apparatus according to embodiments of the present invention.

With reference to FIG. 1, an apparatus 10 according to preferred embodiments of the present invention is shown therein. As illustrated, the apparatus 10 is adapted to clean a surface of a wafer substrate 5. However, it will be appreciated by those of skill in the art from the description herein that various features and aspects of the apparatus and the methods described hereinbelow may be used for cleaning or otherwise treating wafers or other types of substrates or workpieces. Additionally, it will be appreciated by those of skill in the art from the description herein that various components and steps as described herein below may be omitted or replaced with other (for example, conventional) components or steps as appropriate.

The wafer 5 may be, for example, a wafer of semiconductor material such as silicon, silicon oxide, gallium arsenide, etc. The wafer 5 has a substantially planar work surface 5A and an opposing substantially planar backside surface 5B. A continuous or discontinuous layer of waste material is disposed on the work surface 5A. The waste layer may be a layer of photoresist, reactive ion etch residue, chemical mechanical polishing residue or post-ion implantation residue. The waste material in the aforementioned layers may include inorganic or organic contaminants such as polymers based on stryenic, acrylic, novolac, cyclic olefinic maleic anhydride resins; etch residue based on ions of fluorine, chlorine, bromine or iodine; and slurry residue containing silica or alumina abrasives with other common slurry additives such as oxidizers, buffers, stabilizers, surfactants, passivating agents, complexing agents, corrosion inhibitors or other agents. Other types of workpieces may be cleaned or otherwise treated using the apparatus including, for example, MEMS, MEOMS, opto-electronic devices, and 3-D micro/nano-structures.

Figure 8:
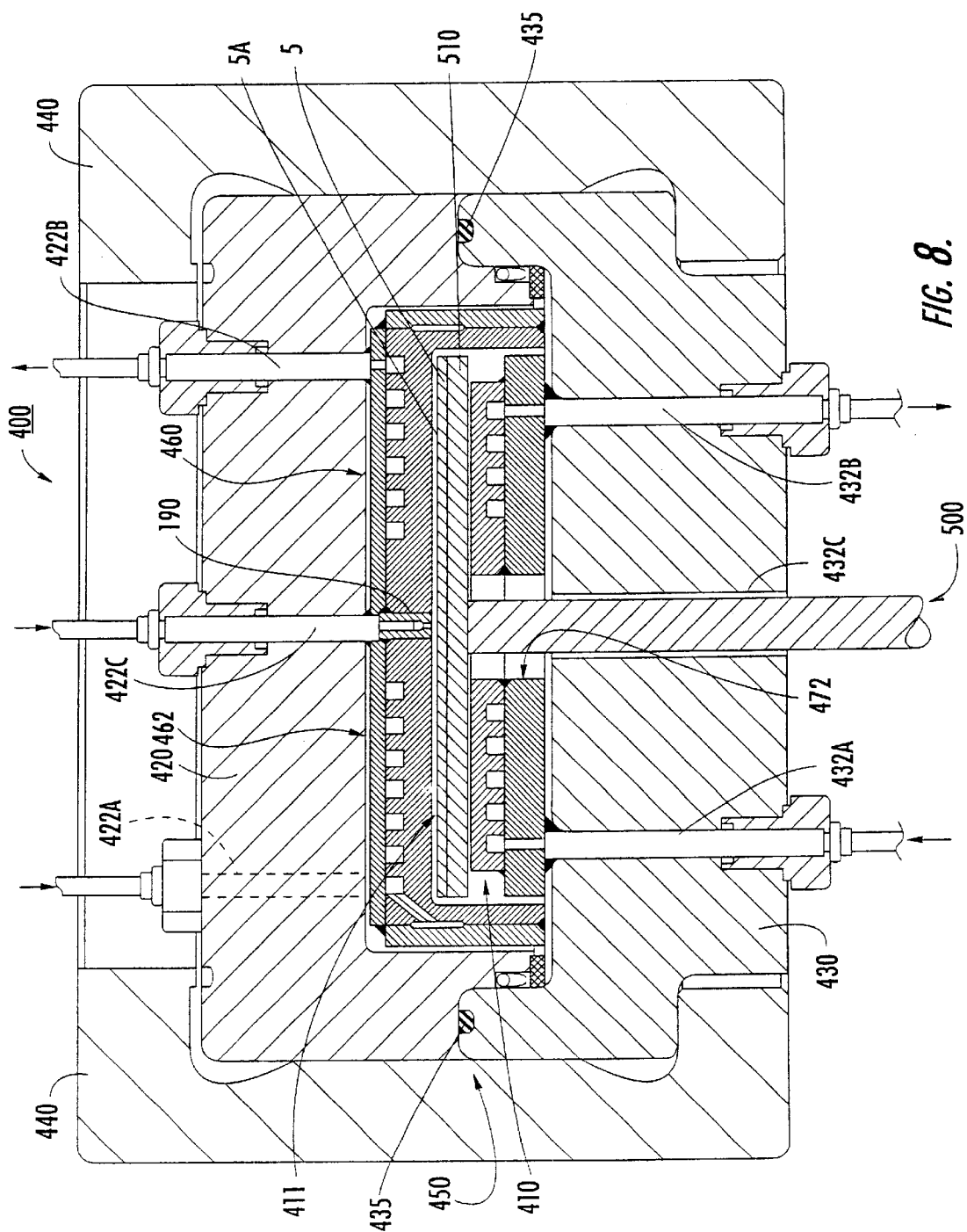
FIG. 8 is a cross-sectional view of a pressure chamber assembly according to embodiments of the present invention in a closed position.

The apparatus 10 includes generally a flow/pressure control system 100, a recirculation system 200, a supply/recovery system 300, a pressure chamber assembly 400, and a substrate handling system 500 (FIG. 8). The pressure chamber assembly 400 includes a pressure chamber 410. As discussed in greater detail below, the wafer 5 is held in the pressure chamber 410 for processing. The flow/pressure control system 100 conditions and applies a chemistry or chemistries (also referred to as adjuncts or modifiers), $CO_2$ (in the form of liquid, gas, and/or supercritical fluid (ScCO$_2$)), and/or a mixture of chemistries and CO$_2$ to the working surface 5A of the wafer 5. The substrate handling system 500 holds the wafer 5 and, optionally, moves the wafer 5 to facilitate uniform cleaning. The recirculation system 200 may be used to filter and return process fluid to the pressure chamber 410. The supply/recovery system 300 supplies the process fluids and may be employed to clean post-process effluent and, optionally, return a portion thereof (typically, recovered CO$_2$) for further use in the apparatus 10.

Turning to the flow/pressure control system 100 in greater detail, the system 100 includes a tank T1 containing CO$_2$ at high pressure. The pressure of the CO$_2$ in the tank T1 is preferably between about 400 psi and 4000 psi, depending on the process(es) to be executed using the apparatus 10. The volume of the tank T1 is preferably at least 5 times the volume of the pressure chamber 410. A temperature control device may be operatively connected to the tank T1. The temperature control device may be, for example, a temperature sensor and a heating coil or probe or heat exchanger. The temperature of the CO$_2$ in the tank T1 is preferably between about 0° C. and 90° C., depending on the processes to be executed using the apparatus 10. The CO$_2$ may be in liquid, gas or supercritical phase.

A plurality of outlet lines L3, L4 and L5 are fluidly connected to the tank T1. In the event that it may be desired to supply liquid CO$_2$ from the tank T1, the lines L3, L4 and L5 preferably draw from a lower portion of the tank T1 (e.g., via a lower outlet or a dip tube). The outlet lines L3, L4 and L5 fluidly connect the tank T1 to a chemistry supply/conditioning system 120 (schematically illustrated in FIG. 1 and described in greater detail below), a feed line L1, and a feed line L2. Valves V1, V2 and V3 are provided to control flow in the lines L3, L4 and L5, respectively.

A plurality of chemistry supplies S1, S2, S3 are fluidly connected to the system 120. Each supply S1, S2, S3 may include a single chemistry or multiple compatible chemistries that are combined at or upstream of the respective supply S1, S2, S3. The supplies may include the respective chemistries disposed in suitable containers. Where feasible, the containers are preferably at atmospheric pressure to allow for convenient refilling.

The chemistries provided by the supplies S1, S2, S3 may include, for example: water; oxidizers such as peroxides or permanganates; acids such as hydrofluoric, sulfuric, and nitric; bases such as secondary and tertiary amines; ammonium hydroxide; solvents such as organic carbonates, lactones, ketones, ethers, alcohols, sulfoxides, thiols, and alkanes; surfactants such as block copolymers or random copolymers composed of fluorinated segments and hydrophilic or lipophilic segments; surfactants with siloxane-based components and hydrophilic or lipophilic components; conventional ionic and non-ionic hydrocarbon-based surfactants; and salts such as ammonium fluoride and choline. Incompatible chemistries are chemistries which, when combined or exposed to one another, tend to react with one another in a manner that impedes the process and/or damages or unduly fouls the apparatus 10 or wafer 5. Examples of incompatible chemistries include acids and bases.

Level sensors may be provided in each of the supplies S1, S2, S3 to indicate that a refill is needed and/or to provide a metric of chemistry use in the process. Means such as a heating coil or jacket may be provided to control the temperatures of the supplies. A mixing device may be provided in each supply S1, S2, S3.

As discussed in more detail below, the system 120 is operable to provide one or more controlled volumes of chemistry (with or without CO$_2$), which volumes may be conditioned by the system 120. The feed lines L1 and L2 are each fluidly connected to the system 120 to receive the volume or volumes of the chemistries. The feed line L1 is fluidly connected to a nozzle 191 in fluid communication with the pressure chamber 410. The feed line L2 is fluidly connected to a spray member 190 in the pressure chamber 410. Filters F1 and F2 are provided in the feed lines L1 and L2, respectively. Preferably and as illustrated, the filters F1, F2 are located downstream of all lines that feed into the feed lines L1, L2.

A vacuum line L16 is fluidly connected to the pressure chamber 410. A vacuum unit P1 is operable to draw a full or partial vacuum in the pressure chamber 410 through the line L16. The vacuum unit P1 may be a pump or one or more tanks that are maintained at or near vacuum at all times by a continuously operating vacuum pump. A vacuum tank may be advantageous in that the pressure chamber 410 may be evacuated more rapidly and the tank may be re-evacuated while wafer processing is occurring. If multiple vacuum tanks are used, they may be staged in their operation to generate greater vacuum in the pressure chamber 410 in less time.

The vacuum unit P1 may be advantageous for managing the air (or ambient gas) introduced to the system. In each batch step, the pressure chamber 410 may be opened and closed to insert and/or remove a substrate. During the time when the pressure chamber 410 is open, the chamber may fill with ambient gas (typically, air). Active control and management using the vacuum unit P1 may be used to prevent this insertion of ambient gas from building up over time in the process fluids (assuming some level of recycling of the process fluids is accomplished).

A circulation line L6 fluidly connects the pressure chamber 410 and the system 120. Preferably, the line L6 draws from a lower portion of the pressure chamber 410.

A secondary gas supply tank T2 is fluidly connected to the pressure chamber 410 with a controllable valve V15 provided therebetween. Preferably, the secondary gas has a higher saturated vapor pressure than CO$_2$. Preferably, the secondary gas is an inert gas. More preferably, the secondary gas is helium, nitrogen or argon.

Pulsing Feature

A variable volume device or pulse generator 102 may be fluidly connected to the pressure chamber 410. The pulse generator 102 includes a chamber 102B and a pressurizing member 102A movable in the chamber 102B. The pulse generator 102 is operable to generate a rapid decrease and/or increase (i.e., pulse) in pressure in the pressure chamber 410. Preferably, the swept volume of the pressurizing member 102A is between about 0.1 and 5 times the volume of the pressure chamber 410. Preferably, the pulse generator 102 is adapted to provide pressure pulsing cycles at a rate of between about 1 cycle/10 seconds and 50 cycles/second. Preferably, the pulse generator 102 is adapted to decrease and/or increase the pressure in the pressure chamber 410 by at least 100 psi, and more preferably by between about 300 psi and 1500 psi.

The pulse mechanism may be any suitable mechanism including, for example, a piston coupled to a linear actuator, a rotating shaft and a connecting rod, a magnetic piston movable by means of an external electric coil, and/or an electrically, pneumatically or hydraulically driven piston or diaphragm. In a hydraulic or pneumatic system, the pulse mechanism may be paired with valving to quickly admit and release pressure to the non-process side of the diaphragm thereby displacing the piston or diaphragm. In one embodiment, the high pressure tank T1 and a low pressure vessel such as T2 may be fluidly connected to provide motive force for the pulse mechanism (piston or diaphragm).

Suitable valving (not shown) may be added such that the pulse chamber 102B is filled from one pathway, a valve in this pathway may be closed and the fluid may thereafter be driven back to the pressure chamber 410 through a second pathway including a filter. The second pathway may feed the returning fluid to the pressure chamber 410 through the spray member 190. The multiple pathways may serve to prevent the reintroduction of contaminants just removed from the wafer or particles generated in the pulse chamber, if a piston is used.

While the pulse generator 102 is illustrated as connected to a bottom portion the pressure chamber 410, the pulse generator 102 may draw from any height of the pressure chamber 410. In particular, it may be desirable to configure the pulse generator 102 to draw from an upper portion when used to facilitate processes utilizing two-phase (liquid/gas) process fluids in the pressure chamber 410 or to affect fluid and particulate flow in the vicinity of the wafer. It may be advantageous to move fluid rapidly away from the substrate surface (vertically), rather than move it across (parallel to) the wafer's surface as a bottom nozzle would. A relatively large pulse chamber may be used to enable particle dislodgement from the wafer surface and also enable particle transport well away from the wafer, to prevent redeposition. A relatively large pulse chamber may also be used to enable phase changes through two phases—such as from supercritical to liquid to gas.

An outlet line L10 and a valve V6 are provided to selectively vent the pressure chamber 410 to a lower pressure region, such as to a low pressure tank T2 as discussed below, a fluid transfer device (e.g., a pump), or atmosphere. Waste effluent from the pressure chamber 410 may be drawn off to the low pressure region.

In addition to allowing removal of waste from the pressure chamber 410, the line L10 and the valve V6 may be used in tandem with the high-pressure tank T1 to generate pressure pulses in the pressure chamber 410. This may be accomplished by raising the pressure in the pressure chamber 410 using the tank T1 (i.e., by controlling one or more of the valves V1, V2, V3 and/or other valves to provide an open path between the tank T1 and the pressure chamber 410), closing the valve V6, and then rapidly dropping the pressure in the pressure chamber 410 by opening the valve V6. The waste effluent may go to a low pressure tank, for example, such as the tank T2. This sequence may be repeated as needed.

Chemistry Supply/Conditioning System

The chemistry supply/conditioning system 120 is operable to provide a selected flow or amount of chemical adjuncts from the supplies S1, S2, S3 (more or fewer supplies may be used) to the pressure chamber 410. Moreover, the system 120 may be operable to selectively control the pressure, temperatures and flow rates of chemistries or chemistry/$CO_2$. In accordance with the present invention, certain alternative configurations may be employed for the system 120 as described hereinbelow. It will be appreciated from the description herein that various aspects and features of the disclosed embodiments may be omitted or combined with or substituted for other aspects and features of the embodiments.

Figure 2:
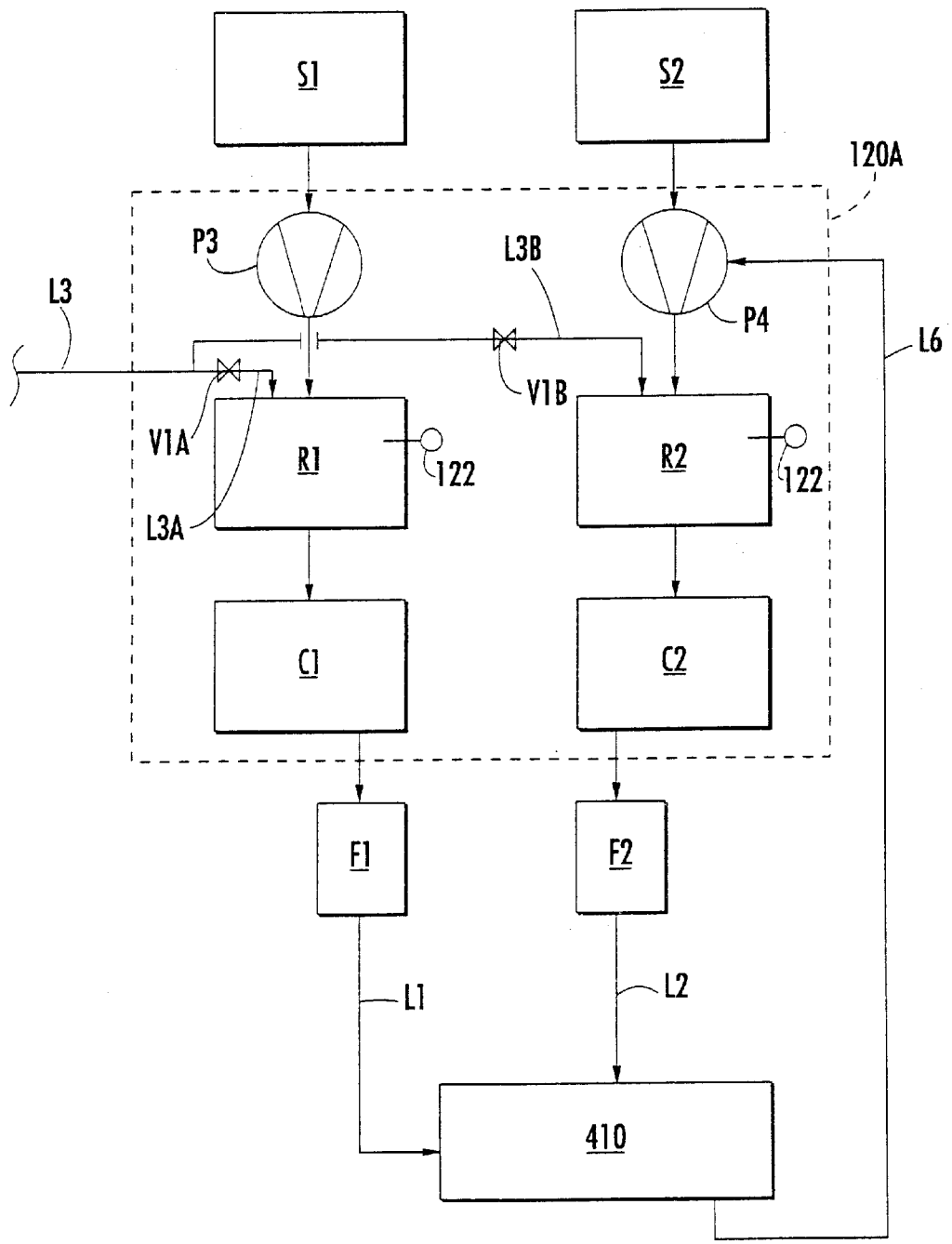
FIG. 2 is a block diagram of a chemistry supply/conditioning system forming a part of the apparatus of FIG. 1.

With reference to FIG. 2, a chemistry supply/conditioning system 120A is schematically illustrated along with certain relevant portions of the apparatus 10. A fluid transfer device P3 selectively draws or permits gravity flow of chemistry fluid ("first flow") from the supply S1 to a reservoir R1 at substantially ambient pressure. A level measuring device 122 measures the volume of the fluid in the reservoir and thereby the volume of the chemistry to be delivered to the pressure chamber 410. The fluid transfer device P3 may also serve to determine the volume of the fluid in the reservoir R1 by metering the flow through the device P3. The chemical adjunct in the reservoir may thereafter drain under force of gravity through a conditioning unit C1 (as discussed below), the filter F1, and the line L1 into the pressure chamber 410.

Alternatively, $CO_2$ (e.g., supercritical $CO_2$ ($ScCO_2$), liquid $CO_2$, or compressed liquid $CO_2$ or gaseous $CO_2$) from the tank T1 may be delivered to the reservoir R1 through a line L3A by operation of a valve V1A. A pressurized mixture of the adjunct and $CO_2$ is thereby delivered to the pressure chamber 410 through the unit C1, the filter F1, and the line L1.

With further reference to FIG. 2, the system 120A is adapted to deliver a second flow of chemistry-containing process fluid to the pressure chamber 410, the second flow including chemistry from the supply S2 which is not compatible with the supply S1. The system 120A provides a flow path for the second flow that is separate from that used for the first flow. The second flow path includes elements P4, R2, 122, and C2 corresponding generally to elements P3, R1, 122, and C1.

In the same manner as discussed above, the second flow may be a chemistry only stream (i.e., no $CO_2$) that is transferred to reservoir R2 via P4 and then through the conditioning unit C2, the filter F2, and the line L2 to the pressure chamber 410. Alternatively, $CO_2$ from the tank T1 may be introduced into the reservoir R2 through a line L3B by operation of a valve V1B such that the adjunct/$CO_2$ is delivered to the pressure chamber 410 under pressure.

FIG. 2 further illustrates the use of the circulation line L6 to return process fluid from the pressure chamber 410 to the reservoir R2 by using P4 or a pressure differential. The returned fluid may be remixed with the second flow for reuse in the process. A further filter (not shown) may be provided in the line L6.

Figure 3:
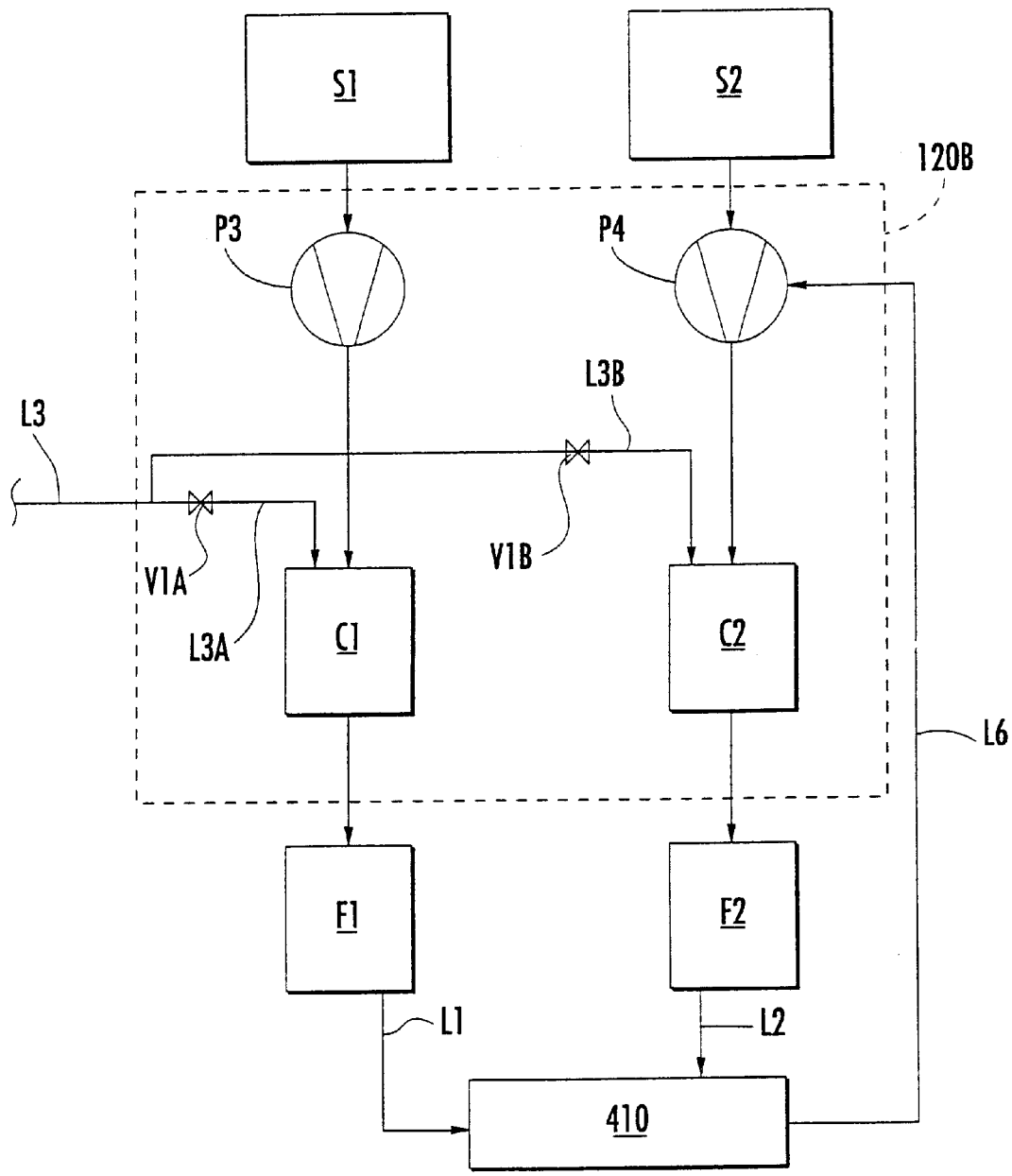
FIG. 3 is a block diagram of an alternative chemistry supply/conditioning system forming a part of the apparatus of FIG. 1.

With reference to FIG. 3, a chemistry supply/conditioning system 120B according to further embodiments of the present invention is shown therein. The system 120B is particularly well-suited for delivering gaseous chemistries. The system 120B corresponds to the system 120A except that the reservoirs R1, R2 are omitted and high pressure $CO_2$ is made directly available to the conditioning units C1, C2 via lines L3A, L3B and valves V1A and V1B. By operation of the fluid transfer device P3 (or P4), the system 120B may inject the adjunct S1 (or S2) through the conditioning unit C1 (or C2) and the filter F1 (or F2) and into the pressure chamber 410. Alternatively, high pressure $CO_2$ may be added to and mixed with the chemistry S1 or S2 in the respective conditioning unit C1, C2. In this case, the volume of the chemistry delivered to the pressure chamber 410 may be measured by metering the flow of the chemistry through the fluid transfer device P3 (or P4) or by measuring the volume change in the supply vessels S1 or S2. The flow rate(s) of chemistries and/or $CO_2$ to the conditioning units C1 and C2 may also be controlled to achieve a desired ratio of $CO_2$ to chemistry in the stream being delivered to chamber 410.

Figure 4:
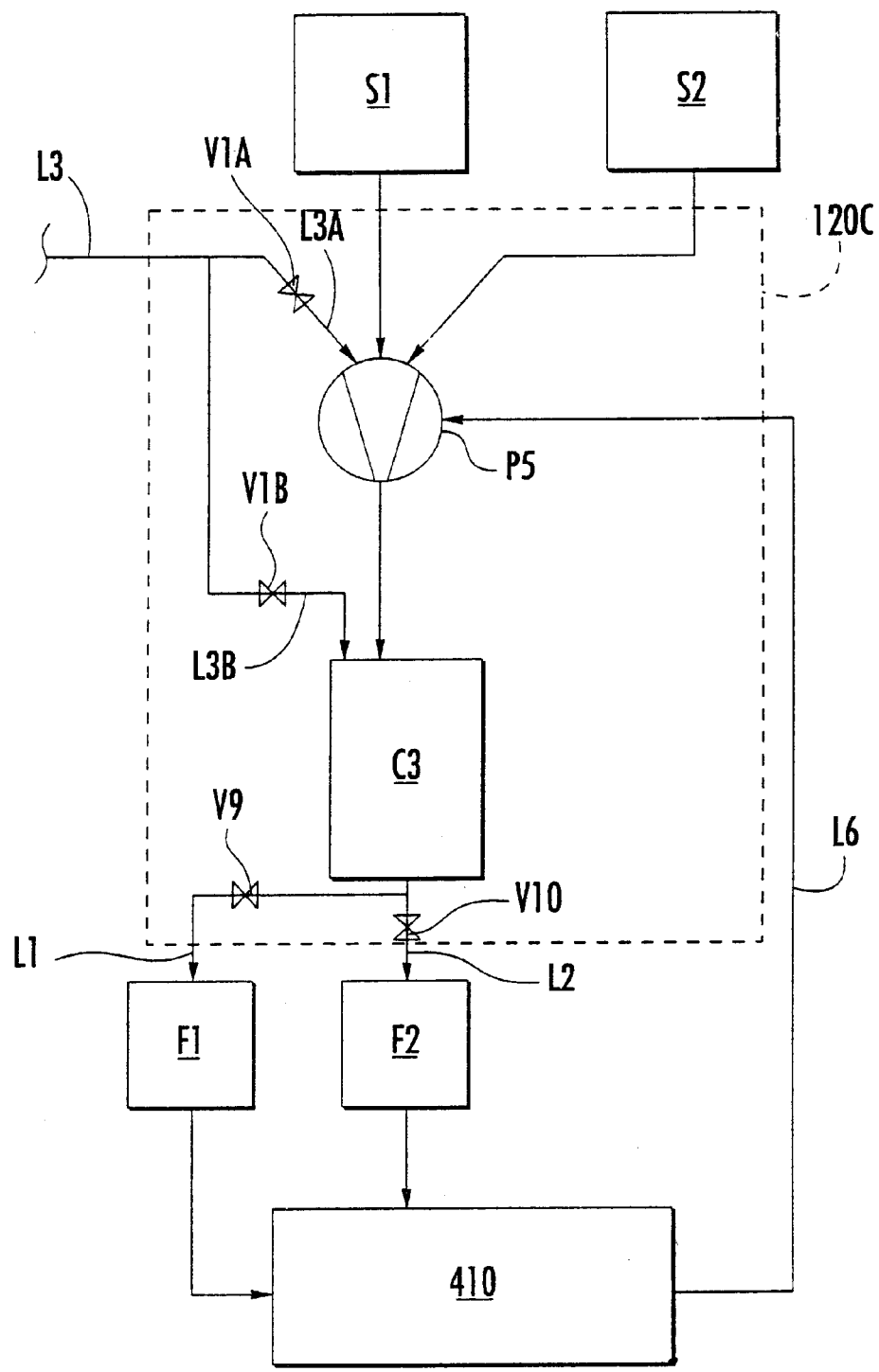
FIG. 4 is a block diagram of a further alternative chemistry supply/conditioning system forming a part of the apparatus of FIG. 1.

With reference to FIG. 4, a chemistry supply/conditioning system 120C according to further embodiments of the present invention is shown therein. The system 120C includes a fluid transfer device P5 operable to selectively draw alternatingly from each of the supplies S1 and S2 as well as the supply of high pressure $CO_2$ from the tank T1 (via line L3A and valve V1A). The device P5 forces the selected chemistry through a conditioning unit C3 and one or both of the filters F1 and F2 (depending on the operation of valves V9 and V10) so that the fluid is ultimately injected into the pressure chamber 410 under pressure. Optionally, $CO_2$ from the tank T1 may be added to the selected chemistry by introducing the $CO_2$ into the conditioning unit C3 using the line L3B and the valve V1B. In order to prevent mixing of the incompatible chemistries S1, S2, $CO_2$ (preferably, pure $ScCO_2$) from the tank T1 is introduced through the line L3A to flush the fluid transfer device P5 and the remainder of the flow path to the pressure chamber 410 shared by the two chemistry flows.

Recirculation System

The recirculation system 200 includes an outlet line L7 fluidly connected to a lower portion of the pressure chamber 410. Lines L8 and L9 are in turn fluidly connected to the line L7 and also to the feed lines L1 and L2, respectively, upstream of the filters F1 and F2. A fluid transfer device P2 is operable to draw fluid from the pressure chamber 410 and force the fluid through the lines L8 and L9 and ultimately back into the pressure chamber 410. The recirculated fluid flow may be combined with other fluid flow in the lines L1 and L2 (e.g., from the system 120 and/or from the lines L3 or L4). Valves V4 and V5 are provided in the lines L8 and L9.

The recirculation system 200 may serve to provide additional fluid mechanical action to the wafer surface without requiring additional removal of $CO_2$ and/or chemistry and introduction of new $CO_2$ and/or chemistry. Moreover, the recirculation system 200 may serve to continuously clean (e.g., filter, distill, or separate components through density modulation) the process fluid during the cleaning process.

Figure 5:
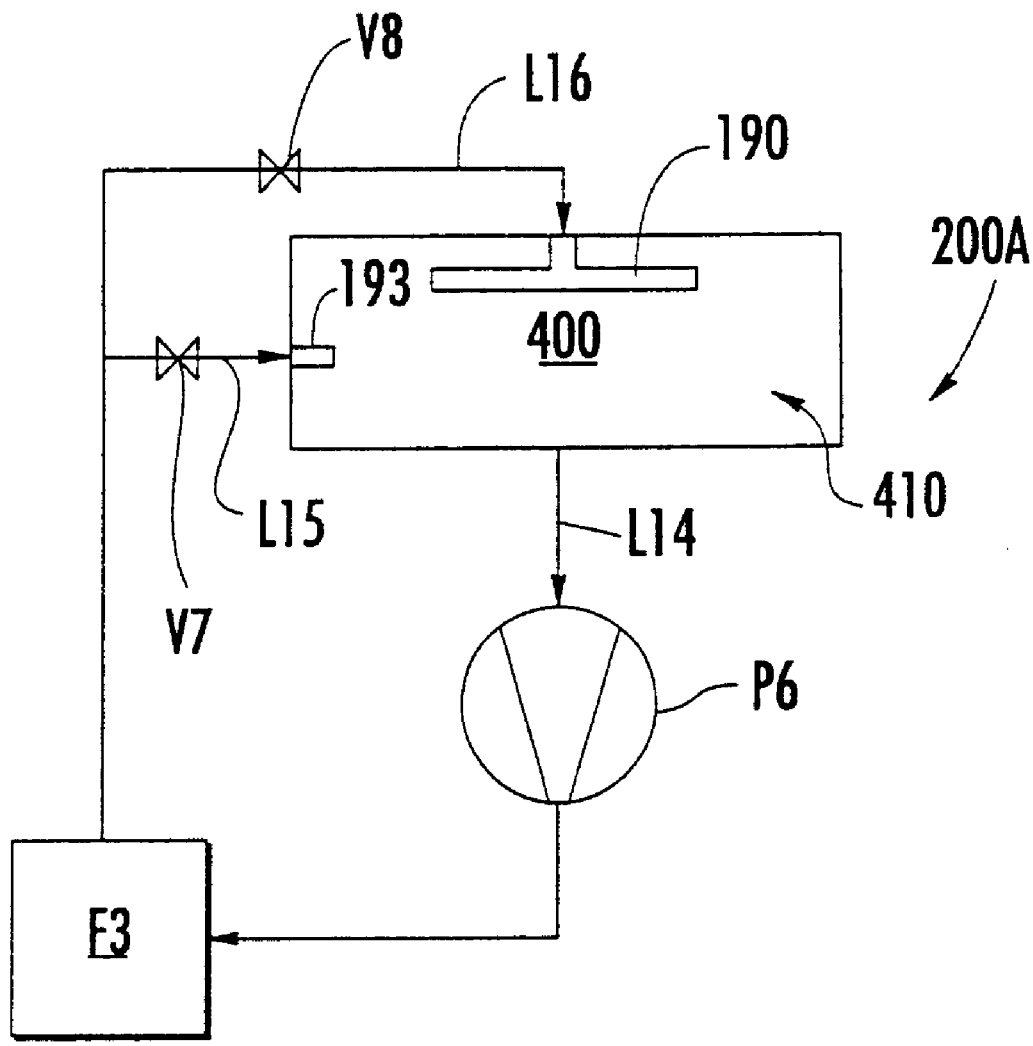
FIG. 5 is a block diagram of an alternative recirculation system forming a part of the apparatus of FIG. 1.

An alternative recirculation system 200A according to the present invention is shown in FIG. 5. The system 200A includes an outlet line L14. Return lines L15 and L16 fluidly connect the line L14 to a recirculation nozzle 193 and the spray member 190, respectively, in the pressure chamber 410. A fluid transfer device P6 is operable to force fluid from the pressure chamber 410 through a filter F3 and back into the pressure chamber 410 through the nozzle 193 and/or the spray member 190. Valves V7 and V8 are provided to enable alternating delivery of fluid to the spray member or recirculation nozzle and to prevent unintended back flow through the nozzle 193.

Figure 6:
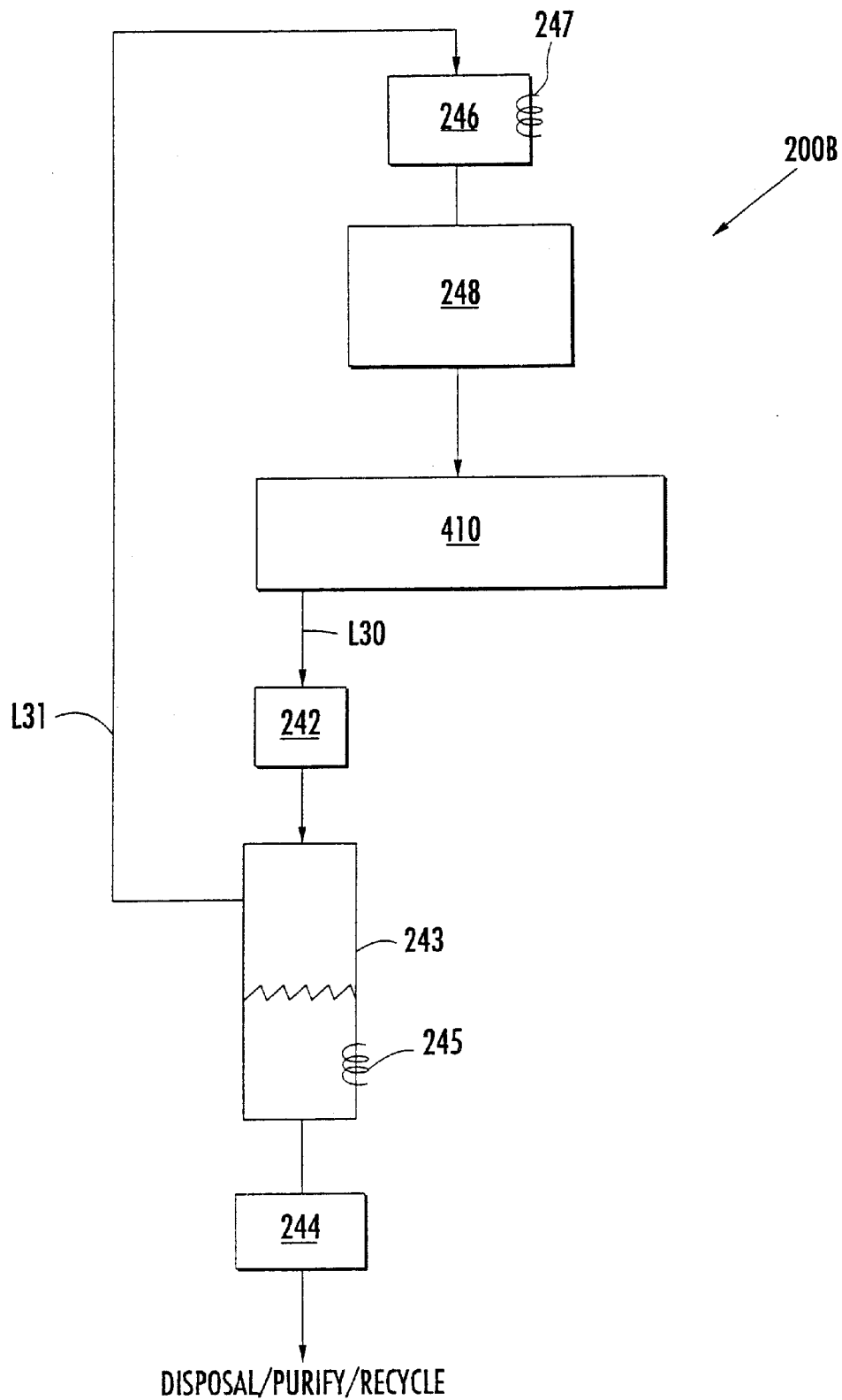
FIG. 6 is a block diagram of a further alternative recirculation system forming a part of the apparatus of FIG. 1.

A further alternative recirculation system 200B according to the present invention is shown in FIG. 6. The system 200B includes an outlet line L30 fluidly connecting the pressure chamber 410 to a still 243 (having a heating element 245) through a transfer system 242. The transfer system 242 converts the waste stream from the pressure chamber 410 from its starting state (e.g., liquid, compressed liquid, or supercritical fluid) to a liquid. Preferably, the transfer system 242 is also adapted to prevent backflow of fluids from the still 243 to the pressure chamber 410. For this purpose, the transfer system 242 may include one or more shut-off valves and/or one-way/check valves.

If the waste stream from the pressure chamber 410 is a liquid, the transfer system 242 may not change the fluid or may merely change the temperature of the fluid (e.g., using a heater or chiller). If the waste stream from the pressure chamber 410 is a compressed liquid, the transfer system may provide a pressure let down (e.g., by means of a torturous path, an orifice, or control valve). The transfer system 242 may also include a temperature-altering element. If the waste stream from the pressure chamber 410 is a supercritical fluid, there is preferably a pressure let-down as discussed above as well as a temperature-altering step. In this case, it may be necessary or desirable to cool the fluid to cross into the 2-phase Liquid/Gas region of the phase diagram.

Once in the liquid state, the fluid is boiled/distilled in the still 243 to separate the fluid into two components: a lighter component, which will be predominantly $CO_2$ gas, and a heavier component which will be predominantly adjunct chemistry and entrained contaminants. The heavier component may be conveyed (e.g., by gravity) to a recycling/disposal system 244.

The $CO_2$ gas (lighter) stream is directed to a heat exchanger 246 via a line L31 where the $CO_2$ gas stream is converted (through manipulation of temperature and pressure) to the conditions of the processing fluid (i.e., liquid, compressed liquid or supercritical fluid). If the fluid starting condition was liquid, the exchanger may include a heat transfer coil 247 connected to the heating device so as to transfer heat from the condensing fluid to the still 243. The $CO_2$ may be additionally cleaned through filtration, adsorption, absorption, membrane separation, physical separation (e.g., centrifugal force) or electrostatic separation. The conditioned $CO_2$ may then be provided back to additionally process the substrate or to process a subsequent substrate. Additional chemistries may be added to this incoming fluid (e.g., at a mixing reservoir 248).

The distilling recirculation system 200B may be used to provide a continuous or intermittent flow of the process fluid through the pressure chamber 410. The mass flow may serve to assist in the cleaning process by transporting particulates away from the wafer 5 (e.g., to prevent redeposit on the wafer) and/or providing mechanical action (agitation) on the wafer surface. The mass flow may be filtered or otherwise conditioned. The mass flow may be fully driven by the addition of heat in the still 243 so that no pumps or other potentially particulate-generating mechanical devices are required. Multiple transfer systems 242, stills 243, heat exchangers 246 may be used to provide increased continuous flow.

Each of the recirculation systems 200, 200A, 200B may be employed to provide mass flow through the chamber 410 without loss of process fluid mass from the process loop (except the relatively small quantities of adjuncts and particulates that are filtered or distilled out of the process fluid stream. Moreover, each of the recirculation systems 200, 200A may be employed to provide mass flow through the chamber 410 without altering the chemical composition of the process fluid.

As depicted in FIGS. 1–5, the filters F1, F2 as well as the filter F3 are preferably adapted to provide filtration of at least particles in the range of 10 nm (as in nanometers) to 50 microns. Suitable filters may include sintered filters, bag-type filters, magnetic filters, electrostatic filters, and/or combinations thereof. Preferably, as in the illustrated embodiments, every fluid stream pathway into the pressure chamber 410 has a filter as its final element before the pressure chamber 410. In particular, all valves and fluid transfer devices for delivering fluid to the pressure chamber 410 are disposed upstream of at least one filter.

The conditioning units C1, C2, C3 may include means for mixing the chemistries of the adjunct or for mixing the adjunct and $CO_2$ (when present) to promote homogeneity and solvation of adjuncts. The conditioning units may also include means for controlling the temperature of the adjunct or adjunct/$CO_2$. Suitable mixing devices or processes include mechanical mixers and flow mixing. Temperature control may be achieved using probes, internal coils, elements, and/or an external jacket, for example. An electrical heater or a fluid heat exchanger may be used, for example.

The fluid transfer devices P3, P4, P5 are preferably capable of accurately and consistently metering a flow of fluid. Suitable devices may include diaphragm pumps, syringe pumps, or piston pumps, for example.

While particular arrangements have been illustrated and described herein, it will be apparent to those of skill in the art that various modifications may be made in keeping with the present invention. For example, in the system 120A (FIG. 2), the circulation line L6 may feed to the fluid transfer device P3 such that the flow from the line L6 is directed to the line L1. Valving (not shown) may be provided to allow selection of the feed line (i.e., L1 or L2) for each flow path, so that the chemistry (with or without $CO_2$) from the supply S1, for example, can be directed to either or both of the spray member 190 and the nozzle 191, as desired. The apparatus 10 may include one or more chemistry supply paths that include an in-line reservoir (i.e., as in the system 120A) and/or one or more parallel chemistry supply paths that are direct injection (i.e., as in the system 120B) and/or one or more parallel chemistry supply paths that serve alternative supplies (i.e., as in the system 120C). Additional filters, fluid transfer devices, reservoirs, conditioning units and valving may be provided as needed to provide additional flexibility.

Cleaning/Pulsing Process

The apparatus 10 may be used to execute a wide range of processes wherein the wafer 5 in the pressure chamber 410 is subjected to fluid streams, pools and atmospheres, including chemical adjuncts, $CO_2$ and mixtures thereof, in various states (e.g., liquid, gas, supercritical fluid). Such processes may serve to clean or otherwise treat (e.g., coat) the wafer surface 5A. For example, the apparatus 10 may be used to conduct methods as disclosed in the following commonly owned U.S. patent applications, the disclosures of which are hereby incorporated herein by reference in their entireties:

1. U.S. patent application Ser. No. 09/951,259; inventors James P. DeYoung, James B. MeClain, Michael B. Cole, and David B. Brainard; filed Sep. 13, 2001; and titled Methods for Cleaning Microelectronic Structures with Cyclical Phase Modulation;
2. U.S. patent application Ser. No. 09/951,249; inventors James P. DeYoung, James B. McClain, Stephen M. Gross, and Joseph M. DeSimone; filed Sep. 13, 2001; and titled Methods for Cleaning Microelectronic Structures with Aqueous Carbon Dioxide Systems;
3. U.S. patent application Ser. No. 09/951,092; inventors James P. DeYoung, James B. McClain, and Stephen M. Gross; filed Sep. 13, 2001; and titled Methods for Removing Particles from Microelectronic Structures;
4. U.S. patent application Ser. No. 09/951,247; inventor(s) James P. DeYoung, James B. McClain, and Stephen M. Gross; filed Sep. 13, 2001; and titled Methods for the Control of Contaminants Following Carbon Dioxide Cleaning of Microelectronic Structures.

The following are exemplary processes that may be practiced in accordance with the present invention.

Preferably, the valving, fluid transfer devices, and sensors are operatively connected to a computerized controller to provide feedback and control as needed to conduct the desired process steps.

Figure 23:
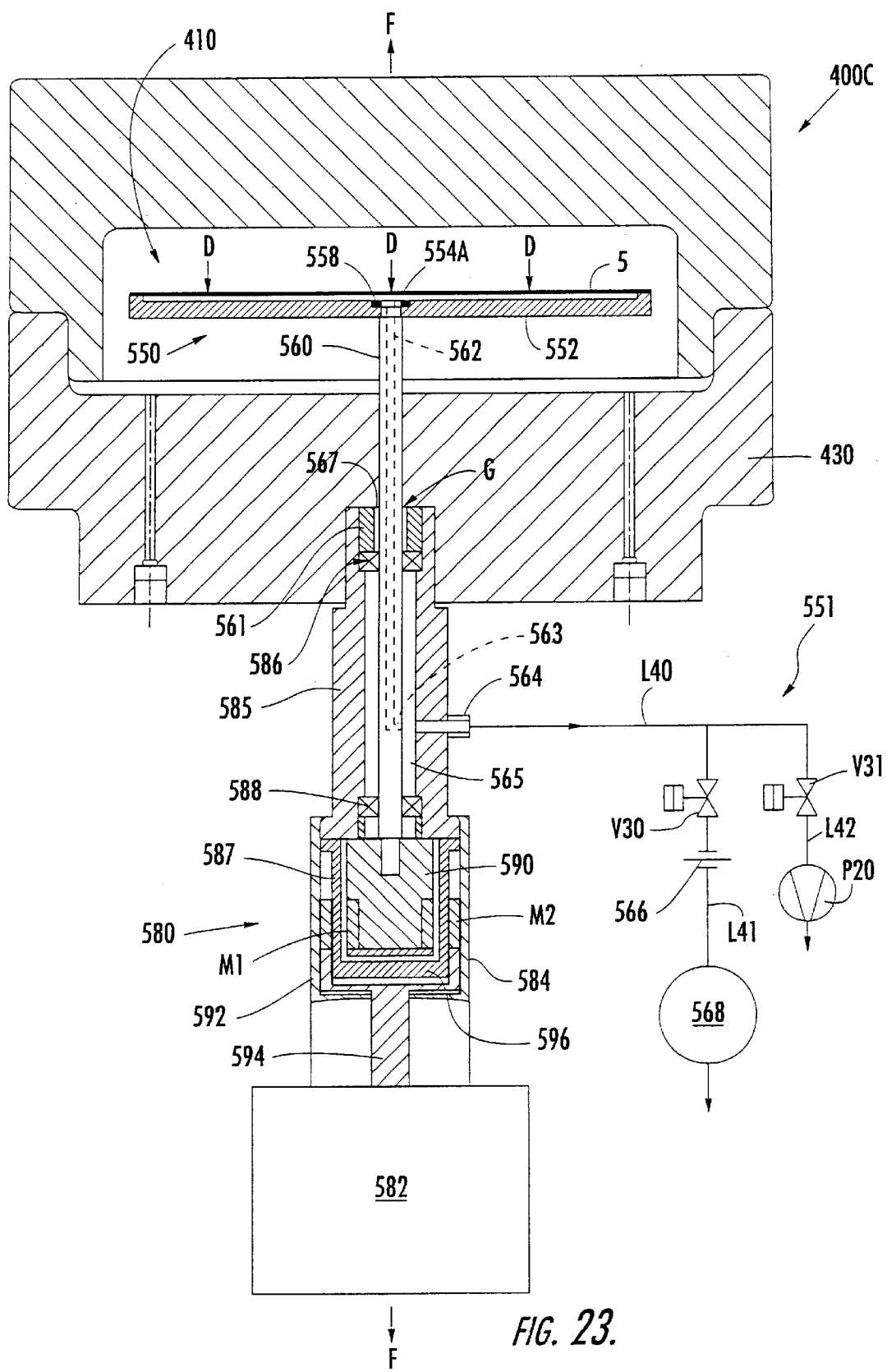
FIG. 23 is a cross-sectional, schematic view of a pressure chamber assembly according to further embodiments of the present invention.

The wafer 5 is inserted into the pressure chamber 410 and secured to the chuck 510 by any suitable means such as adhesive or clamps. More preferably, the wafer 5 is secured to the chuck in one of the manners described below with regard to the wafer holding assemblies 520 (FIG. 19) and 550 (FIG. 23). The door of the pressure chamber is thereafter closed and sealed.

Air and any other gases in the pressure chamber 410 are evacuated from the pressure chamber 410 through the line L16 using the vacuum unit P1.

Optionally, chemistry from one or more of the supplies S1, S2, S3 may be applied to the wafer using the chemistry supply/conditioning system 120 prior to pressurizing the pressure chamber 410.

The pressure chamber 410 is thereafter pressurized with $CO_2$ (preferably liquid $CO_2$ or Sc$CO_2$) from the high-pressure tank T1. Preferably, the pressure chamber 410 is pressurized to a pressure of at least 400 psi, and more preferably, between about 800 psi and 3000 psi. Additionally, the atmosphere in the pressure chamber 410 is maintained at a selected temperature (preferably between about 10° C. and 80° C.), for example, using a guard heater as discussed below.

Once the pressure chamber 410 is pressurized to the selected pressure, dense-phase $CO_2$ is circulated through the line L2 to the spray member 190 and/or the nozzle 191. The spray member directs the dense-phase $CO_2$ onto the wafer surface 5A. Optionally, chemistry, with or without liquid or supercritical $CO_2$ mixed therewith, from one or more of the supplies S1, S2, S3 may be applied to the wafer using the chemistry supply/conditioning system 120.

The pulse generator 102 and/or the high-pressure tank T1 and the valve V6 are then used to effectuate cyclical phase modulation (CPM). More particularly, the pulse generator 102 and/or the high-pressure tank T1 and the valve V6 are operated (with appropriate temperature control of the process fluid) to effect phase changes between liquid, supercritical, and gas states. Preferably, the phase changes are effected between supercritical and liquid states in a cyclical fashion. For example, CPM processes as disclosed in the commonly owned U.S. patent application Ser. No. 09/951,259; inventors James P. DeYoung, James B. McClain, Michael B. Cole, and David E. Brainard; filed Sep. 13, 2001; and titled Methods for Cleaning Microelectronic Structures with Cyclical Phase Modulation, the disclosure of which is hereby incorporated herein by reference in its entirety, may be conducted.

During the CPM cycles, $CO_2$ or $CO_2$ with chemistry may be applied to the wafer 5 via the spray member 190. Fluid and particulate matter from the pressure chamber 410 may be removed from the pressure chamber 410 and recirculated locally via the recirculation system 200 or 200A and/or recirculated via the line L6 and the system 120.

The process fluid (dense-phase $CO_2$, adjuncts and waste matter) is removed from the pressure chamber 410 via the line L10. As discussed below, $CO_2$ may be withdrawn from the pressure chamber 410 to a recovery tank. The process pathways (including the pressure chamber 410) may be flushed one or more times with pure liquid or supercritical $CO_2$ from the tank T1.

The foregoing steps of optionally applying one or more of the chemistries S1, S2, S3 to the wafer (with or without Sc$CO_2$), conducting CPM and removing the process fluid may be repeated as needed. Following the final CPM cycle, the process fluid is removed and optionally a rinsing fluid (e.g., a co-solvent or surfactant) is dispensed from the supplies S1, S2, S3 onto the wafer 5 (preferably under pressure from the spray member 190).

The pressure chamber 410 and the process pathways (including the recirculation pathway) are thereafter flushed with $ScCO_2$ from the tank T1 to remove adjuncts and remaining residues. If no rinse fluid is used, a pure $CO_2$ (liquid or supercritical) fluid is used to remove adjuncts and remaining contaminants from the substrate. The flushing dense-phase $CO_2$ may be recirculated, but is finally removed via the line L10. A final rinse of the wafer 5 and the pressure chamber 410 is preferably conducted using pure liquid or supercritical $CO_2$.

Thereafter, the pressure chamber 410 is depressurized and the wafer 5 is removed.

Preferably, the apparatus 10 is operable to apply the process fluid from the spray member 190 onto the wafer surface at a pressure of at least 400 psi, and more preferably between about 800 psi and 3000 psi. The process may include applying the process fluid to wafer using the spray member 190 with the spray member 190 rotating relative to the wafer. Either or both the spray member (e.g., the spray member 190 or the spray member 602) and the chuck (e.g., the chuck 510, 522, or 552) may be rotationally driven.

Moreover, a flow of process fluid may be provided across the wafer 5 by feeding the process fluid into the chamber 410 via a feed nozzle (e.g., the nozzle 191) and simultaneously removing process fluid through one or more of the outlet lines (e.g., the line L7, the line L10, the line L11, and/or the line L6). Preferably, the apparatus 10 is operable to provide such a flow through the chamber 410 at a rate of at least 2 gpm.

As noted above, the process may include simultaneously pulsing the density of the $CO_2$ containing process fluid and spraying the process fluid onto the wafer 5. Likewise, if the phase modulation is accomplished using the pulse generator 102, a flow of the process fluid through the chamber 410 may be provided at the same time as the density modulation. The wafer 5 and/or the spray member 190 may be simultaneously rotated.

In each of the foregoing steps involving the application of chemistries, the chemistries may be any suitable chemistries. In particular, it is contemplated that the chemistries may include co-solvents, surfactants, reactants, chelants, and combinations thereof. Notably, the separate flow paths and/or flushing means of the chemistry supply system 120 may be used to safely and effectively add incompatible chemistries to the chamber 410.

The apparatus may deliver process components in different states (e.g., liquid, gas, supercritical) to the chamber 410 and may allow for components in different states to coexist in the chamber 410. The apparatus may provide heated $CO_2$ gas (e.g., from the tank T1) to drain or flush process components from the cleaning chamber for cleaning steps using liquid $CO_2$. Alternatively, the apparatus may deliver a secondary gas such as helium, nitrogen or argon from the secondary gas tank T3 to displace process fluids during a cleaning step and preceding a rinse step when either liquid or supercritical $CO_2$ is used as the primary process fluid during the cleaning step. The apparatus may also provide heated $ScCO_2$ (e.g., supercritical $CO_2$) at a temperature higher than that of the primary processing fluid but at a density lower than that of the primary processing fluids used to displace processing fluids after a cleaning step, but prior to a rinse step for cleaning steps using $ScCO_2$.

Supply/Recovery System

The supply/recovery system 300 is adapted to supply and/or recycle and resupply $CO_2$ and/or chemistry to the cleaning process. As the process proceeds, some $CO_2$ will be lost. The process may include batch cycles where the pressure chamber 410 is pressurized and depressurized many times in succession as the substrates (e.g., wafers are moved through the $CO_2$-based processing equipment). For example, some $CO_2$ will be lost to atmosphere when the pressure chamber is opened to remove and replace wafers. Some $CO_2$ will be lost from the system in the waste stream that is drained from the system. Substantial amounts of the $CO_2$ will be contaminated or otherwise rendered unsuitable or potentially unsuitable for further recirculation through the process loop. For these reasons, it is necessary to provide sources of additional $CO_2$ to replenish the $CO_2$ lost from the process. Additionally, it may be desirable to recycle $CO_2$ as well as chemistry for reuse in the apparatus 10 or elsewhere.

Stock CO2 Supply

Figure 7:
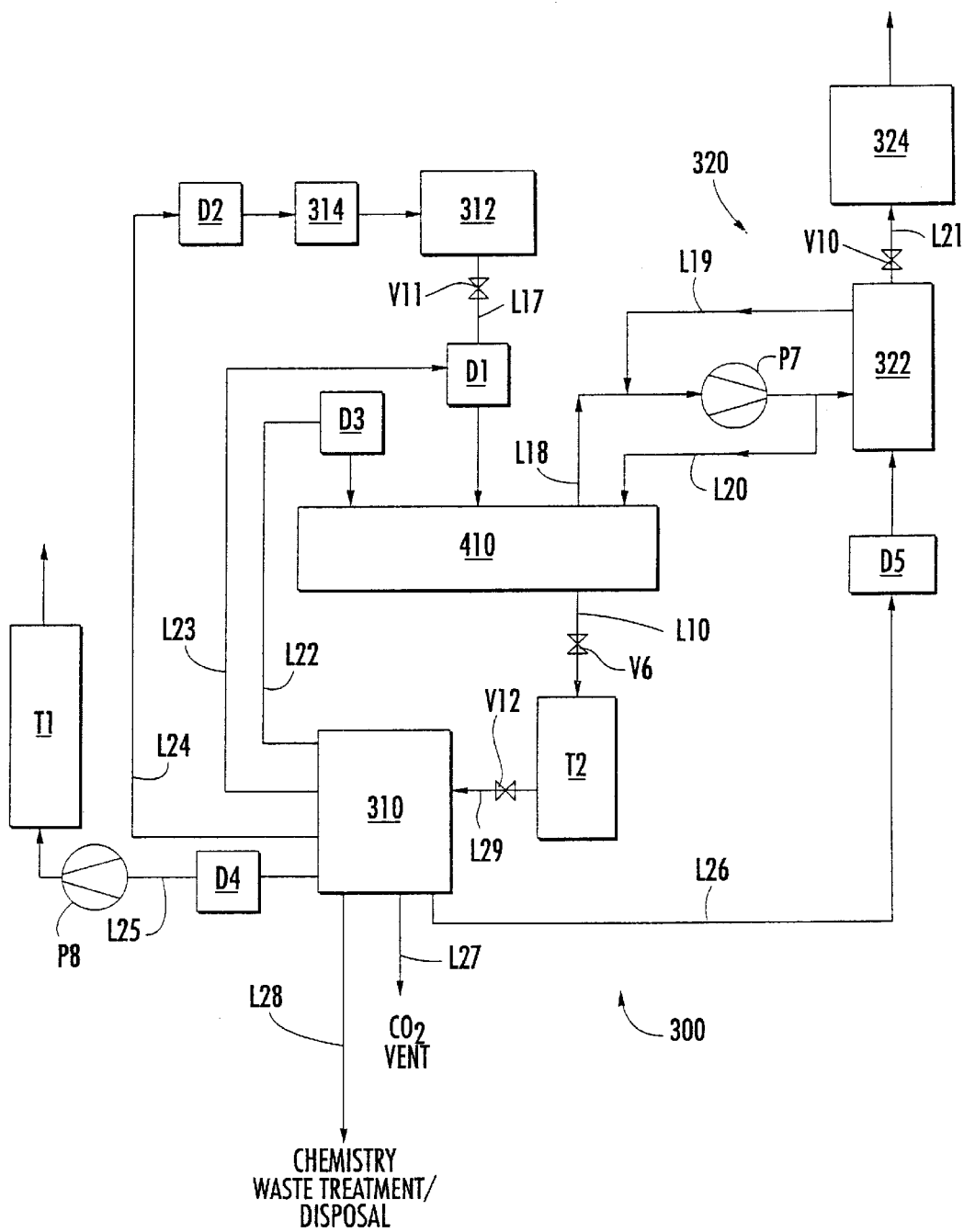
FIG. 7 is a block diagram of a supply/recovery system according to embodiments of the present invention.

With reference to FIG. 7, the supply/recovery system 300 includes a $CO_2$ stock supply 312. The supply 312 may be, for example, $CO_2$ supplied in one or more liquid cylinders, carboys of sub-ambient liquid, or bulk supply systems of sub-ambient liquid. The storage method preferably allows for supply of either liquid or gaseous $CO_2$.

The supply 312 is fluidly connected to the process chamber 410 via a line L17, which is provided with a valve V11 to control the flow into the pressure chamber 410. Preferably, the system 300 is adapted such that the $CO_2$ from the supply can be delivered directly (i.e., without aid of any fluid transfers devices, pressurizing tanks, or the like) into the pressure chamber 410 at a desired pressure (preferably between about 15 and 50 psig). The supply 312 may be from a gas or liquid source.

$CO_2$ as commonly distributed for industrial and commercial uses (e.g., food processing such as carbonation of beverages and freeze-drying, pH control, or dry ice) is not sufficiently clean for processing of micro-electronic substrates. Commonly, such $CO_2$ supplies include contaminants such as organic materials, other gases, water and particulate matter. Accordingly, the system 300 may include a purification unit D1 between the supply 312 and the pressure chamber 410. The purification unit D1 is operative to purify the $CO_2$ supply to the requisite ultra-high cleanliness and purity. In this manner, the purification unit D1 enables the effective use of food grade or industrial grade $CO_2$, thereby allowing the use of existing supply chains and distribution chains for $CO_2$.

The purification unit D1 may include one or more of the following means for filtering gas or liquid $CO_2$:
1. Distillation: The $CO_2$ may be drawn from a gaseous supply or a gaseous portion of the supply. Liquid $CO_2$ may be drawn, boiled, relocated to a collection volume and re-condensed;
2. Filtration;
3. Membrane separation (preferably paired with distillation); and
4. Absorption/adsorption (e.g., capture based on attractive forces or molecule size).

$CO_2$ may also be delivered to the process (and, more particularly, to the pressure chamber 410) by introducing additional $CO_2$ into the vapor-saver unit 320 discussed below. Preferably, this additional $CO_2$ is first purified using a purification unit corresponding to the purification unit D1.

Waste Stream Handling

As noted above in the discussion regarding the process, at various times (including, typically, at the end of each run), processing fluid may be removed from the pressure chamber 410 via the line L10. Such fluids may include liquid, gaseous, or supercritical $CO_2$, chemistry, and various contaminants (e.g., particles dislodged from the wafer(s)).

The system 300 includes a low-pressure tank T2 to receive the waste stream drawn removed from the pressure chamber 410. The tank T2 is preferably maintained at a pressure of between about ambient and 3000 psi. The volume of the tank T2 is preferably at least 5 times the volume of the pressure chamber 410.

Different compositions may be expelled to the tank T2, in which case the tank T2 is a segmented tank or multiple tanks. The pressure in the tank T2 is less than that of a pressure head upstream of and fluidly communicating with the pressure chamber 410 so that the pressure differential forces the waste stream into the tank T2 from the pressure chamber 410. Preferably, the high-pressure tank T1 provides the pressure head so that no pump or other mechanical device is required.

The reduction in pressure of the $CO_2$ as it is transferred from the pressure chamber 410 to the tank T2 may be used to facilitate separation. Supercritical $CO_2$ process fluid may be expanded through a pressure reduction device (e.g., a control valve or orifice) to a lower pressure. At this lower pressure, components of the processing fluid (e.g., chemical adjuncts or entrained contaminants) may be rendered insoluble, thereby facilitating the efficient separation of the expanded stream into a light-fluid $CO_2$ stream and a heavy-fluid (insoluble) alternate stream.

A supercritical $CO_2$ process fluid may also be expanded through a pressure reduction to the two-phase Liquid/Gas area of the phase diagram. This may enable the segmentation of different process fluids in different segmented volumes of a divided tank or multiple tanks. Such segmentation may be advantageous to could mitigate the generation of mixed waste streams, which may be more costly to manage than single component fluid streams. Segmentation may also enable the utilization of distillation for separation of the processing fluid components (e.g., separation of $CO_2$ for recycle from chemical adjuncts and entrained contaminants for disposal).

A liquid process fluid stream may be expanded and heated to the gas-state. This would allow a continuous distillation-like separation of components (i.e., evaporation of flash evaporation), for example, as described below with regard the distillation system 340.

Recycling and Abatement

The waste stream received in the tank T2 is thereafter transferred to a recycling/abatement station 310 through a line L29 (which is provided with a valve V12). The waste stream may be transferred by means of a pump or the like, but is preferably transferred using a non-mechanical means such as pressure differential and/or gravity. To the extent the waste stream has been separated in the tank T2, there may be two of more separate lines delivering the respective separated streams for separate handling by the unit 310. These streams may be treated and directed by the system 300 in the following manners:

1. $CO_2$ may be disposed of through controlled venting or draining via a line L27 to a safe atmospheric discharge and/or collection for unrelated use;

2. $CO_2$ may be directly supplied to the pressure chamber 410 via a line L22. The $CO_2$ is preferably purified by means of a purification unit D3. The $CO_2$ as delivered to the pressure chamber 410 through the line L22 may be at greater than atmospheric pressure, in which case it may be used to perform or augment the pressurization of the main processing chamber at the beginning of each cycle;

3. $CO_2$ may be directed to the purification unit D1 through the line L23 and thereafter into the pressure chamber 410;

4. Gaseous $CO_2$ may be directed through a purification unit D2, through a liquefying unit 314 (which adjusts the pressure and chills the $CO_2$ gas), and supplied to the stock $CO_2$ supply 312 for further use in the manner described above;

5. $CO_2$ may be passed through a purification unit D4 and repressurized and supplied to the high-pressure tank T1 through a line L25 using a pressurizing device (e.g., a pump) P8;

6. $CO_2$ may be directed via a line L26 through a purification unit D5 to a vapor saver tank 320 as discussed below; and 7. Chemical adjuncts and contaminants may be treated and/or disposed of/recycled through a line L28 and in accordance with good chemical stewardship.

Vapor Recovery

Following draining of the process fluid from the pressure chamber 410, a pressurized $CO_2$ vapor will remain in the pressure chamber 410. It is desirable and often necessary to remove this vapor prior to opening the pressure chamber 410 to remove the substrate(s) (e.g., wafer(s)).

One method for depressurizing the chamber is to vent the chamber using a controlled release. Alternatively, a compressor or pump may be used to draw down the pressure in the pressure chamber 410.

The pressure of the $CO_2$ may also be reduced using a vapor recovery system 322 and method as follows. Such methods and apparatus may employ features and aspects of the methods and apparatus disclosed in U.S. patent application Ser. No. 09/404,957, filed Sep. 24, 1999 and in U.S. patent application Ser. No. 09/669,154, filed Sep. 25, 2000.

A vapor recovery tank or pressurized container 322 is used to rapidly capture $CO_2$ (typically, gas or SCF) at the end of a process cycle through a line L18. The captured $CO_2$ is typically a gas or supercritical fluid, but may be a liquid (in which case, the venting is preferably from the bottom of the chamber 410 to avoid formation of solid/dry ice). In this manner, the pressure chamber 410 may be depressurized very rapidly. Advantageously, the capturing method is not constrained by the volumetric throughput of a mechanical device (e.g., a compressor). The volume of the vapor recovery tank 322 is preferably on the order of one to 500 times the volume of the pressure chamber 410.

The captured $CO_2$ may be handled in any desired manner, including:

a) it may be disposed of through a line L21 having a valve V10, and preferably through a surge tank 324;

b) using the line L21 and surge tank 324, it may be recovered and recycled for use in another application (e.g., a $CO_2$-based fire suppression system or a storage container for recycle for use in some other service);

c) it may be recovered and recycled for use in the same application (compressed and/or liquified, and/or converted into SCF) and re-supplied to the processing system or to the $CO_2$-supply system;

d) it may be used in the next processing step to pressurize the pressure chamber 410 (which may be a prerequisite for pressurizing the pressure chamber 410 up to sufficient pressure to effectively add $CO_2$-based processing fluids).

The vapor recovery system may include a compressor P7 for assisting the transfer of material from the pressure chamber 410 to the vapor recovery tank(s). For example, at the end of a processing cycle, the pressure chamber 410 may be at high pressure ($CO_2$-gas at vapor pressure or a supercritical fluid, 300<P (psia)<3000) and the vapor recovery tank may be at a low pressure. In order to depressurize the pressure chamber 410 to a low (e.g., ambient) pressure very quickly (e.g., to allow opening of the chamber and removal of the substrate) while saving the majority of the $CO_2$, the two chambers may be equalized, and then:

a) a compressor may be used to push more $CO_2$ from the main processing chamber to the vapor-saver tank; and b) a second vapor recovery tank may be used (e.g., in cascading manner) to again rapidly equilibrate and additionally lower the pressure of the pressure chamber 410.

A compressor may also be used to remove the material from the vapor recovery tank(s) between the end of a first run and the end of the next run at which time the vapor recovery tank(s) may be required to be at low pressure again. The captured $CO_2$ may be handled in any of the manners described above.

It will be appreciated that various valving and flow control apparatus in addition to that illustrated may be employed in the system 300. The vapor-saver system 320 and the several options for handling the $CO_2$ from the waste stream of line L10 are independent and any may be eliminated from the system 300 as desired. Each of the purification units D2, D3, D4, D5 may correspond to the purification unit D1 (i.e., may use any of the methods listed above—distillation, filtration, membrane separation, and absorption/adsorption). As an alternative to the several purification units D2, D3, D4, D5, two or more of these purification units may be combined so that the respective flow paths each have a common extent through the shared purification unit and thereafter diverge.

Pressure Chamber Assembly

Figure 9:
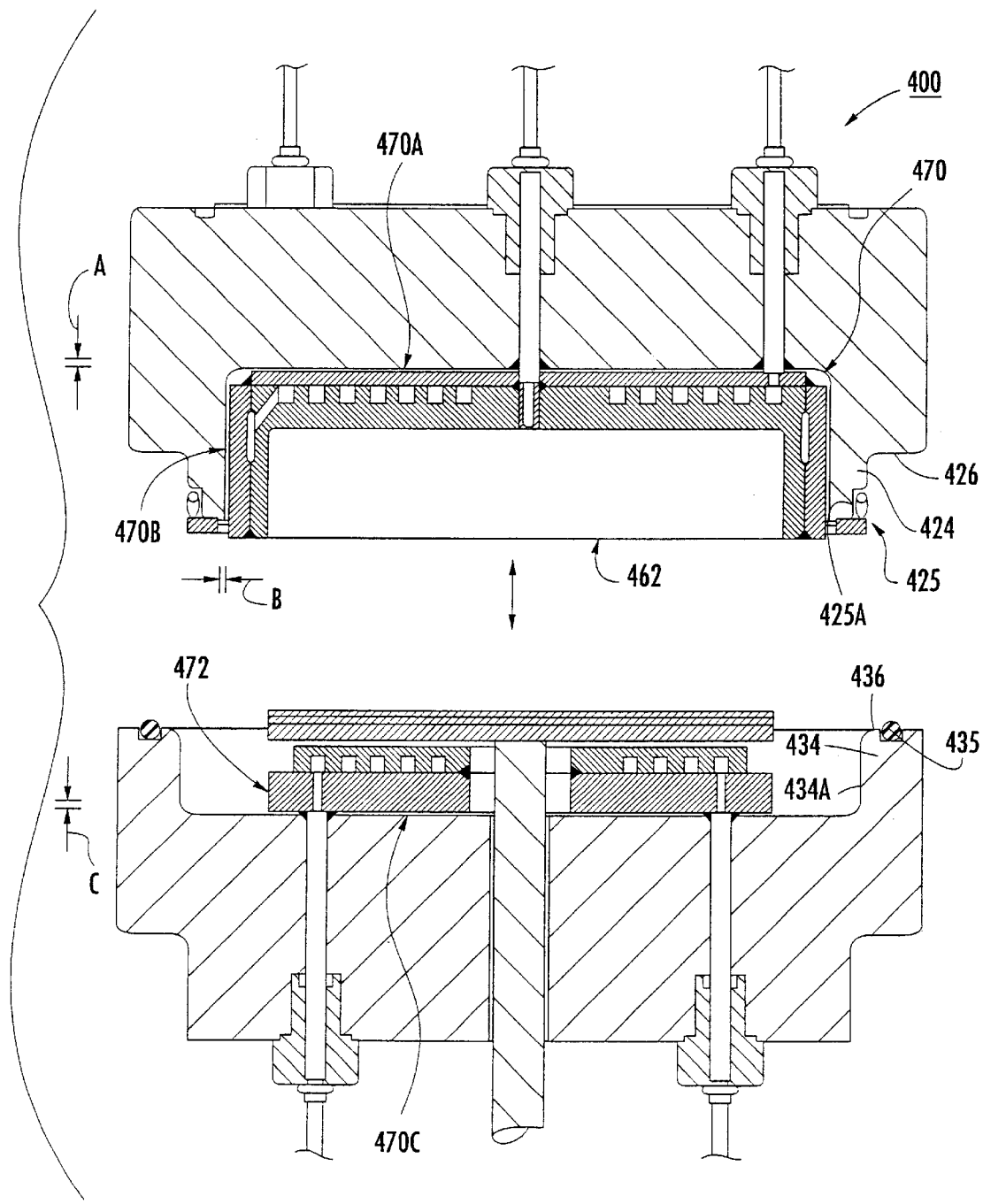
FIG. 9 is a cross-sectional view of the pressure chamber assembly of FIG. 8 in an open position.

With reference to FIGS. 8 and 9, the pressure chamber assembly 400 includes an upper casing 420 and a lower casing 430. When in a closed position as shown in FIG. 8, the casings 420, 430 define a pressure chamber 410 therebetween and a sealing system 450 as described in more detail below seals the chamber 410. When in a closed position as shown in FIG. 8, a pair of opposed clamps 440 surround end portions of the casings 420, 430 to limit separation of the casings 420, 430. The clamps 440 can be displaced to allow the casings 420, 430 to be separated into an open position as shown in FIG. 9.

Guard Heater

A guard heater assembly 460 is disposed in the chamber 410 and includes an upper guard heater 462 and a lower guard heater 472. The guard heater assembly 460 defines a holding volume 411 between the heaters 462, 472. A platen or chuck 510 is disposed in the holding volume 411 between the guard heaters 462, 472 and is adapted to support the wafer 5 for rotation about a vertical axis between the guard heaters 462, 472. A spray member 190 is mounted in a groove 464F the upper guard heater 462 and adapted to direct fluid through nozzles 192 onto the working surface 5A of the wafer.

The casings 420, 430 are preferably each unitarily formed of stainless steel or other suitable metal. Passages 422A, 422B, 422C are formed through the casing 420. Passages 432A, 432B, 432C are formed through the casing 430. As best seen in FIG. 9, the casing 420 has an annular flange 424 with an outer, annular recess 425 formed therein and defined in part by a vertical wall 425A. The casing 430 has an annular flange 434 with an annular groove 435 formed therein. The flange 434 has a vertical wall 434A. The casings 420 and 430 have opposing annular abutment faces 426 and 436, respectively.

Figure 10:
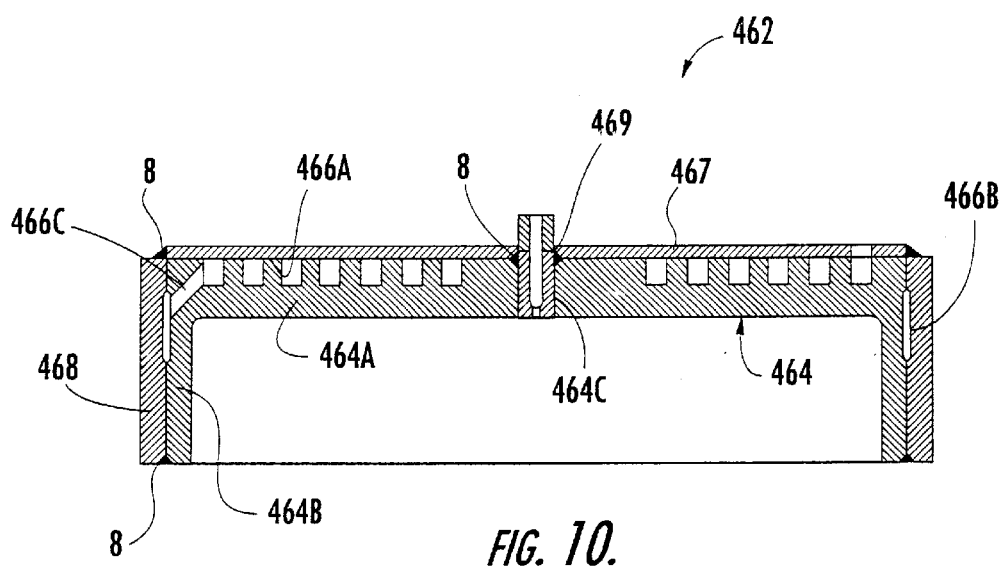
FIG. 10 is a cross-sectional view of an upper guard heater forming a part of the pressure chamber assembly of FIG. 8.
Figure 11:
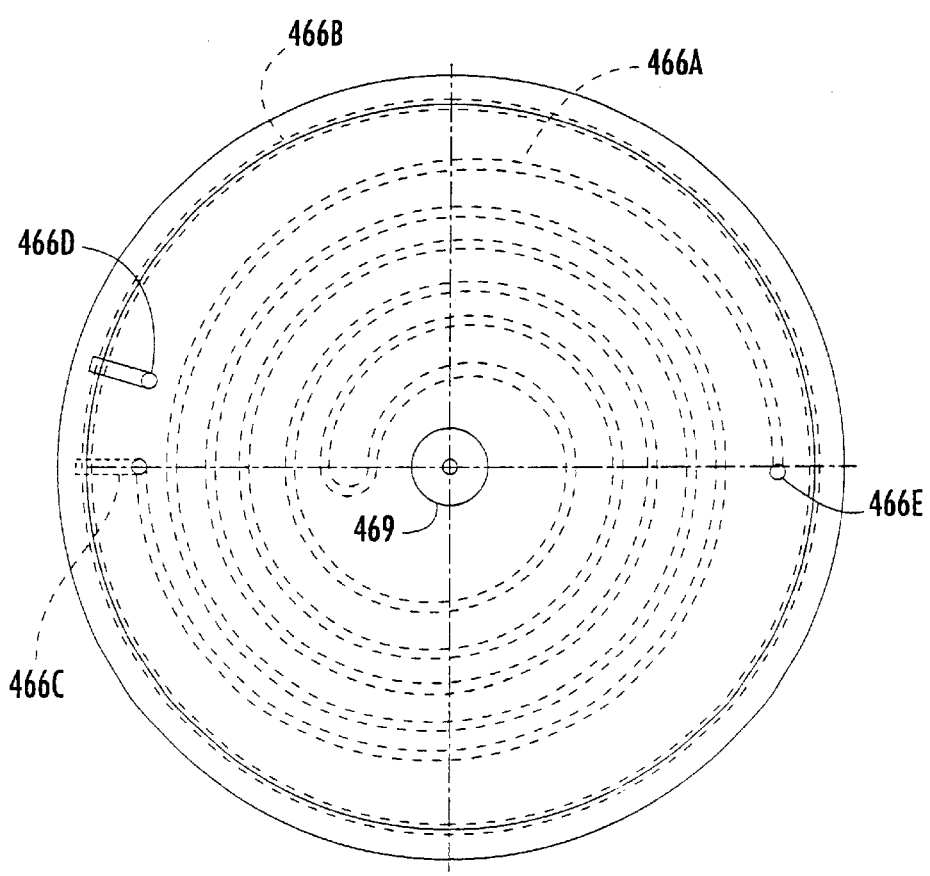
FIG. 11 is a top plan view of the upper guard heater of FIG. 10.
Figure 12:
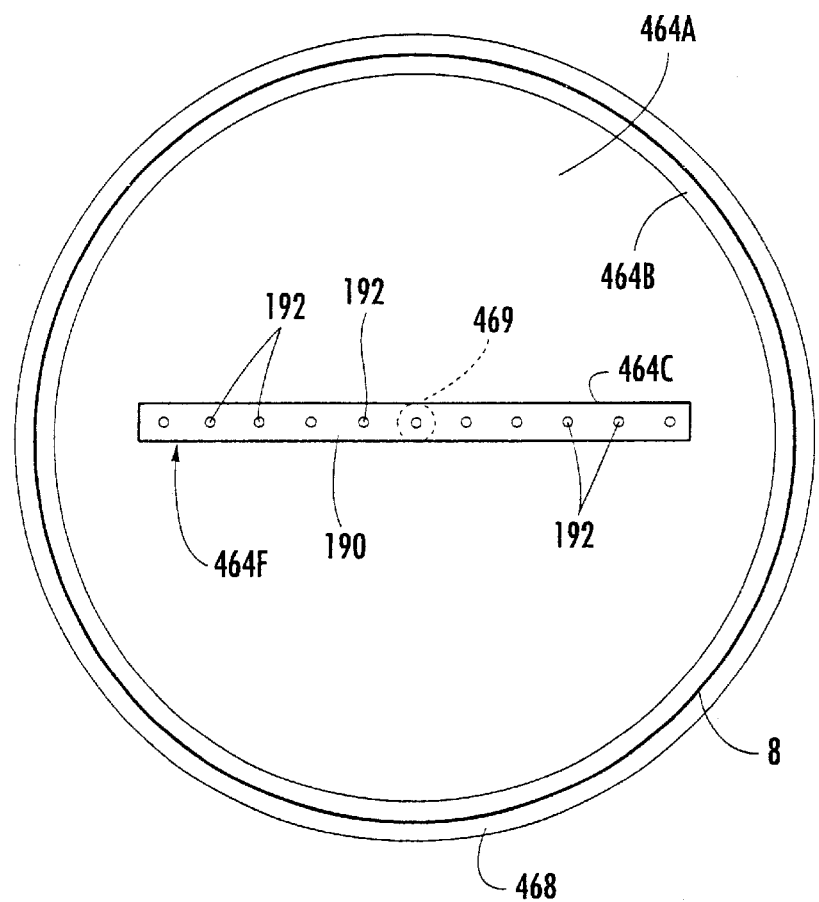
FIG. 12 is a bottom plan view of the guard heater of FIG. 10.

With reference to FIGS. 10–12, the upper guard heater 462 includes an interior member 464 having a top wall 464A and an annular side wall 464B. A spiral flow channel 466A is formed in the top wall 464A. An outer plate 467 covers the top wall 464A. An annular surrounding member 468 surrounds the side wall 464B and defines an annular surrounding channel 466B therewith. A channel 466C fluidly connects the channels 466A and 466B. An inlet 466D in the top plate 467 fluidly connects the passage 422A to the channel 466B, and an outlet 466E fluidly connects the passage 422B to the channel 466A. The outer plate 467 and the wall 468 are secured to the interior member 464 by welds 8, for example. The spray member 190 extends through an opening 467A in the outer plate 467 and is retained (e.g., by an upstream nozzle or screws) in a groove 464C in the top wall 464A. The nozzles 192 of the spray member 190 are fluidly connected to the passage 422C. The interior member 464, the outer plate 467 and the surrounding wall 468 are preferably formed of stainless steel. The guard heater 462 may be secured to the casing 420 by screws with small standoffs holding the screws off of the walls.

Figure 13:
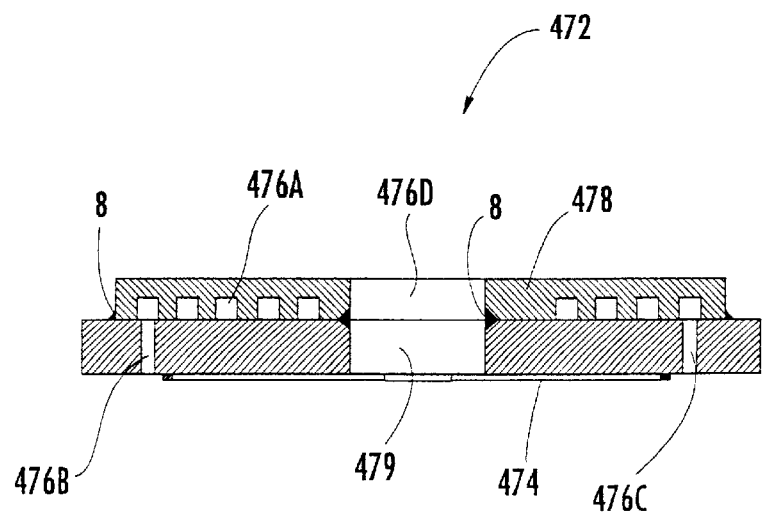
FIG. 13 is a cross-sectional view of a lower guard heater forming a part of the pressure chamber assembly of FIG. 8.
Figure 14:
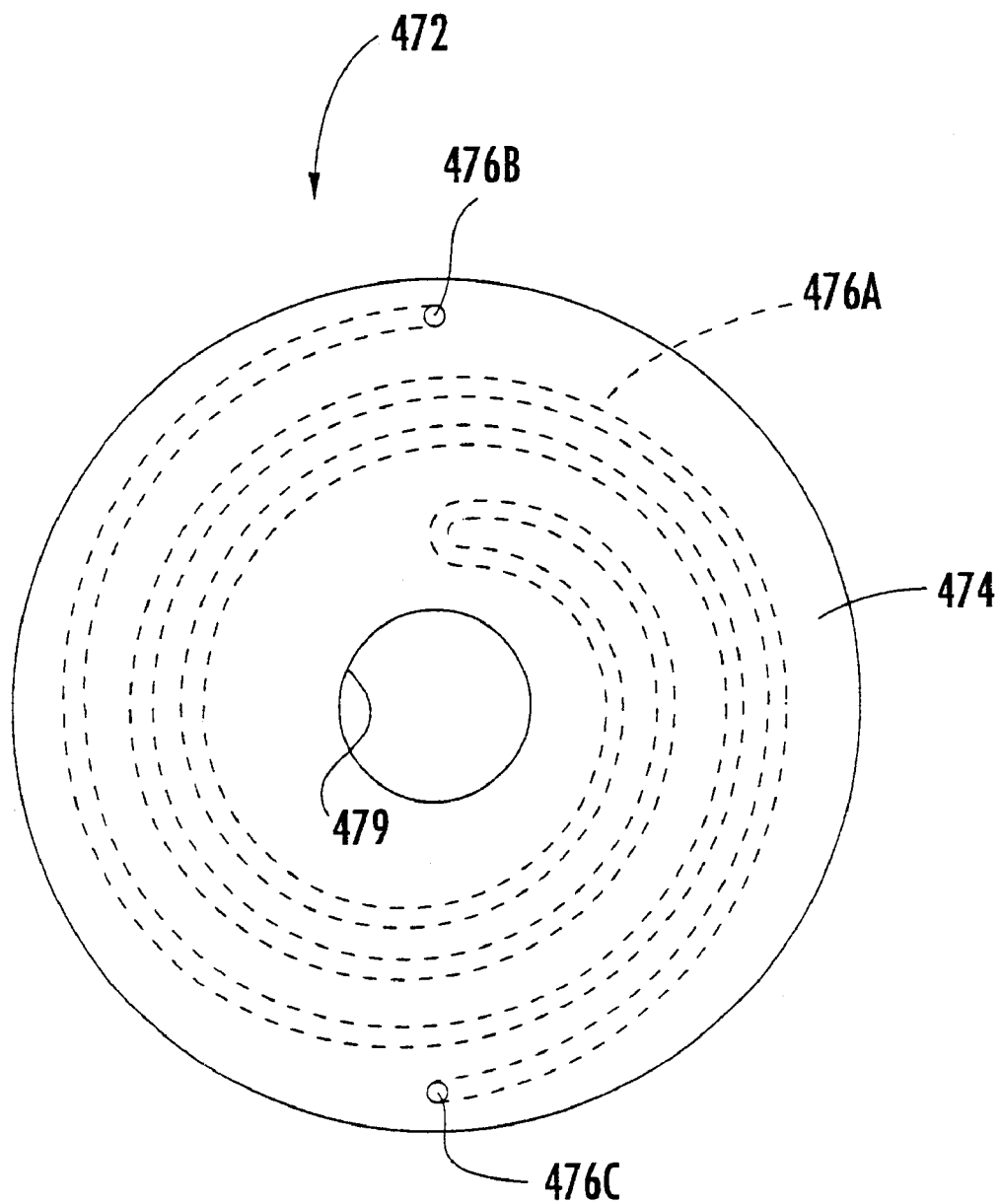
FIG. 14 is a bottom plan view of the lower guard heater of FIG. 13.

With reference to FIGS. 13 and 14, the lower guard heater 472 includes an interior member 478 and an outer plate 474 secured thereto by welds 8, for example. An opening 479 extends through the outer plate 474, and an opening 476D extends through the interior member 478. A spiral flow channel 476A is formed in the interior member 478. An inlet passage 476B in the outer plate 474 fluidly connects the passage 432A to the channel 476A, and an outlet passage 476C fluidly connects the passage 432B to the flow channel 476A. The interior member 478 and the outer plate 474 are preferably formed of stainless steel or other suitable metal. The guard heater 472 may be secured to the casing 430 by screws with small standoffs holding the screws off of the walls.

Preferably, the guard heaters 462, 472 each have a surface area (i.e., the "interior", inwardly facing surfaces) to volume ratio of at least 0.2 $cm^2/cm^3$. More preferably, the guard heaters 462, 472 each have a surface area to volume ratio of between about 0.2 and 5.0 $cm^2/cm^3$, and most preferably of about 0.6 $cm^2/cm^3$.

As discussed above, the temperature of the wafer environment (i.e., the chamber 410 and the fluid(s) therein) is preferably controlled during and between the cleaning and other process steps. The temperature in the chamber 410 is controlled using the guard heater assembly 460. More particularly, a flow of temperature control fluid is introduced through the passage 422A, through the inlet opening 466D, through the channel 466B, through the passage 466C, through the passage 466A, through the outlet opening 466E and out through the passage 422B. In this manner, heat from the temperature control fluid is transferred to the guard heater 462 to heat the guard heater 462 (when the fluid is hotter than the guard heater 462) or, alternatively, heat from the guard heater 462 is absorbed and removed by the fluid to cool the guard heater 462 (when the fluid is cooler than the guard heater 462). The lower guard heater 472 may be heated or cooled in the same manner by a temperature control fluid that flows through the passage 432A, through the inlet opening 476B, through the channel 476A, through the outlet opening 476C, and through the passage 432B.

The temperature control fluids may be any suitable fluid, preferably a liquid. Suitable fluids include water, ethelyne glycol, propelyne glycol, mixtures of water with either ethelyne or propelyne glycol, Dowtherm A (diphenyl oxide and diphenyl), Dowtherm E, (0-dichlorobenzene), mineral oil, Mobiltherm (aromatic mineral oil), Therminol FR (chlorinated biphenyl). Most preferably, the temperature control fluids are a 50%/50% mixture of water and ethelyne glycol. The fluid may be heated by any suitable means such as an electric, gas-fired or steam heater. The fluid may be cooled by any suitable means such as fluid chiller, for example, of vapor compression refrigeration type or evaporative type.

The guard heater assembly 460 and the casings 420, 430 are spaced apart to define an insulating gap 470 therebetween that substantially envelopes the guard heaters 462, 472. More particularly, an insulating gap 470A is defined between the outer plate 467 and the adjacent surrounding wall portions of the casing 420 and preferably has a width A. An insulating gap 470B is defined between the surrounding wall 468 and the adjacent wall of the casing 420 and has a width B. An insulating gap 470C is defined between the outer plate 474 and the adjacent surrounding wall portion of the casing 430 and has a width C. Preferably, each of the widths A, B and C is at least 0.1 mm. More preferably, each of the widths A, B and C is between about 0.1 and 10 mm, and most preferably about 1.0 mm.

The insulating gap 470 may serve to substantially increase the efficiency, controllability and manufacturing throughput of the system 10. The insulating gap 470 may substantially thermally insulate the guard heaters 462, 472 from the casings 420, 430 so that the effect of the temperatures of the casings 420, 430 on the atmosphere surrounding the wafer 5 is reduced or minimized. Restated, the insulation gap 470 may substantially limit the thermal mass that must be heated or cooled by the temperature control fluids to the thermal masses of the guard heaters 462, 472. Accordingly, the temperature of the process fluid may be controlled such that it is substantially different than that of the casings 420, 430.

While a fluid flow heating/cooling arrangement is illustrated and described above, other means for heating/cooling the guard heaters 462, 472 may be employed in addition to or in place of fluid heating. For example, electrical resistance coils (e.g., designed to radiate heat directly to the wafer) may be provided in the guard heaters 462, 472.

Figure 18:
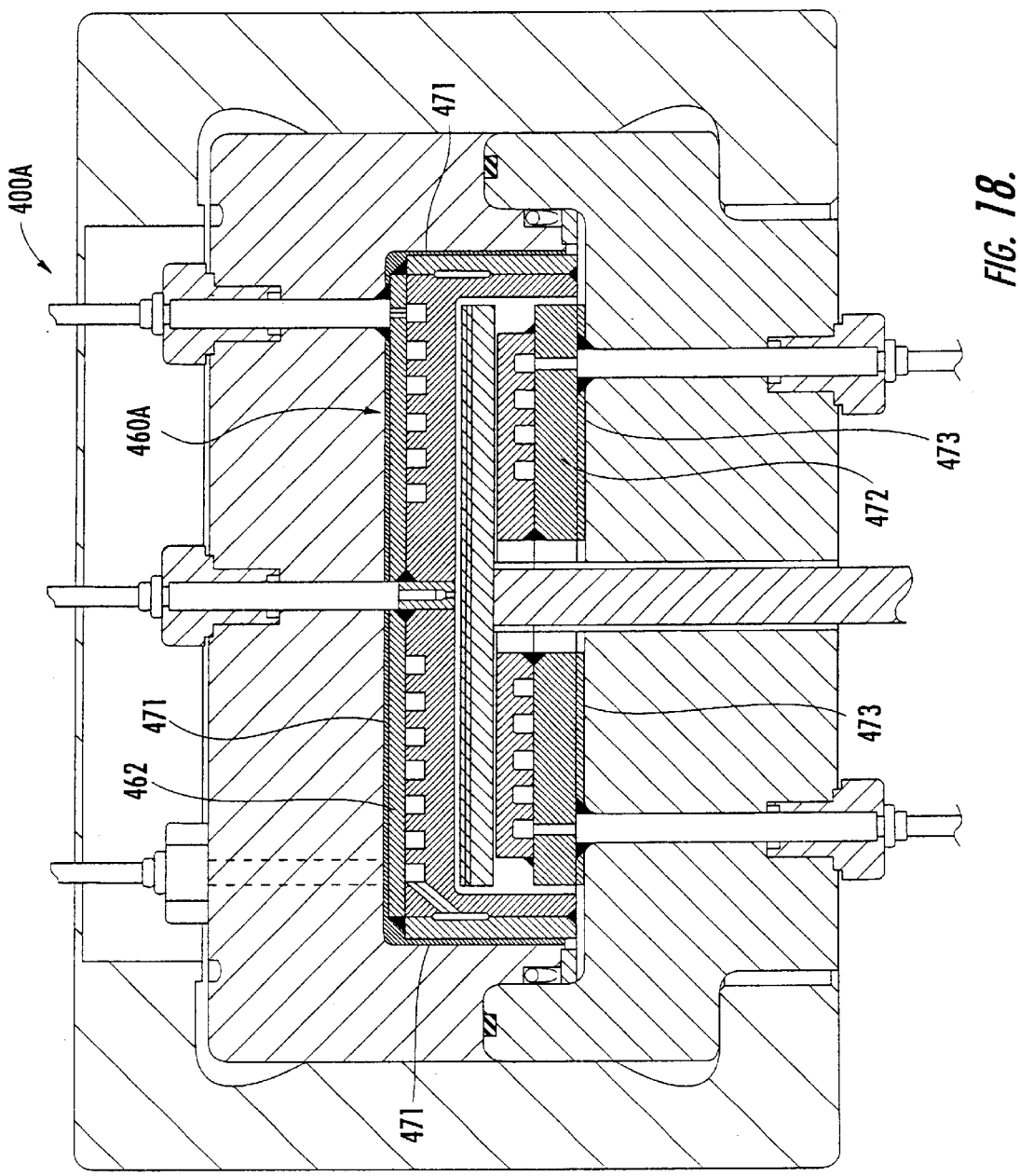
FIG. 18 is a cross-sectional view of a pressure chamber assembly according to further embodiments of the present invention.

With reference to FIG. 18, a pressure chamber assembly 400A according to alternative embodiments of the present invention is shown therein. The assembly 400A differs from the assembly 400 only in that the guard heater assembly 460A thereof includes insulating layers 471, 473 in place of the insulating gap 470. The guard heaters 462, 472 may be secured to the insulating layers 471, 473 which are in turn secured to the casings 420, 430, respectively.

The insulating layers 471, 473 may be formed of crystalline fluoropolymers such as PCTFE (polychlorotrifluoroethylene), PTFE (polytetrafluoroethylene), or PVF2 (polyvinylidene difluoride). Preferably, the insulating layers 471, 473 are formed of bulk PTFE, virgin PTFE or glass-filled PTFE. The insulating layers 471, 473 may be honey-combed, open cellular, or otherwise constructed or configured to enhance the insulating performance thereof.

Preferably, the guard heater assemblies 460, 460A are adapted to provide temperatures in the pressure chamber 410 ranging from about 0° C. to 90° C. Preferably, the guard heater assemblies 460, 460A are adapted to provide heat to the atmosphere in the pressure chamber 410 at a maximum rate of at least 500 joules/second.

Pressure Chamber Sealing System

The casings 420, 430 which define the pressure chamber 410 also define a fluid leak path 3 (FIG. 15) at the interface from the pressure chamber 410 to an exterior region 7 (e.g., the ambient atmosphere (directly or indirectly)). The sealing system 450 is adapted to restrict (fully or partially) the flow of fluid along the fluid leak path 3.

Figure 15:
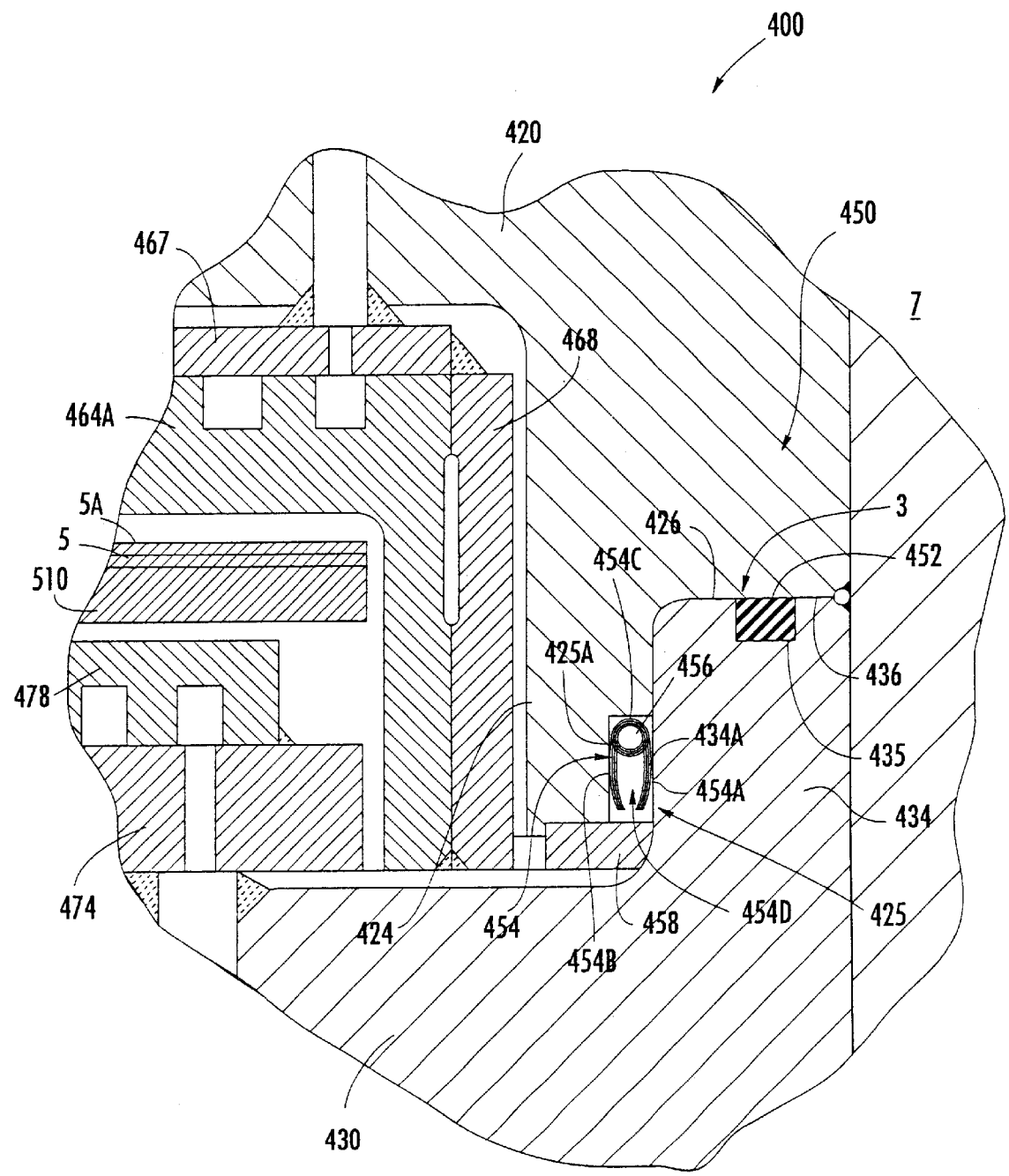
FIG. 15 is an enlarged, cross-sectional, fragmentary view of the pressure chamber assembly of FIG. 8.

As best seen in FIG. 15, the sealing system 450 includes an O-ring 452, an annular cup (or chevron) seal 454, an annular spring 456 and an annular retaining ring 458. As discussed below, the combination of the seals 452, 454 serves to improve the effectiveness and durability of the pressure chamber seal.

The retaining ring 458 is fixed to the flange 424 and extends radially outwardly toward the flange 434 and below the recess 425. The retaining ring 458 may be formed of stainless steel or other suitable material. The retaining ring 458 may be secured to the flange 424 by any suitable means, for example, threaded fasteners.

Figure 16:
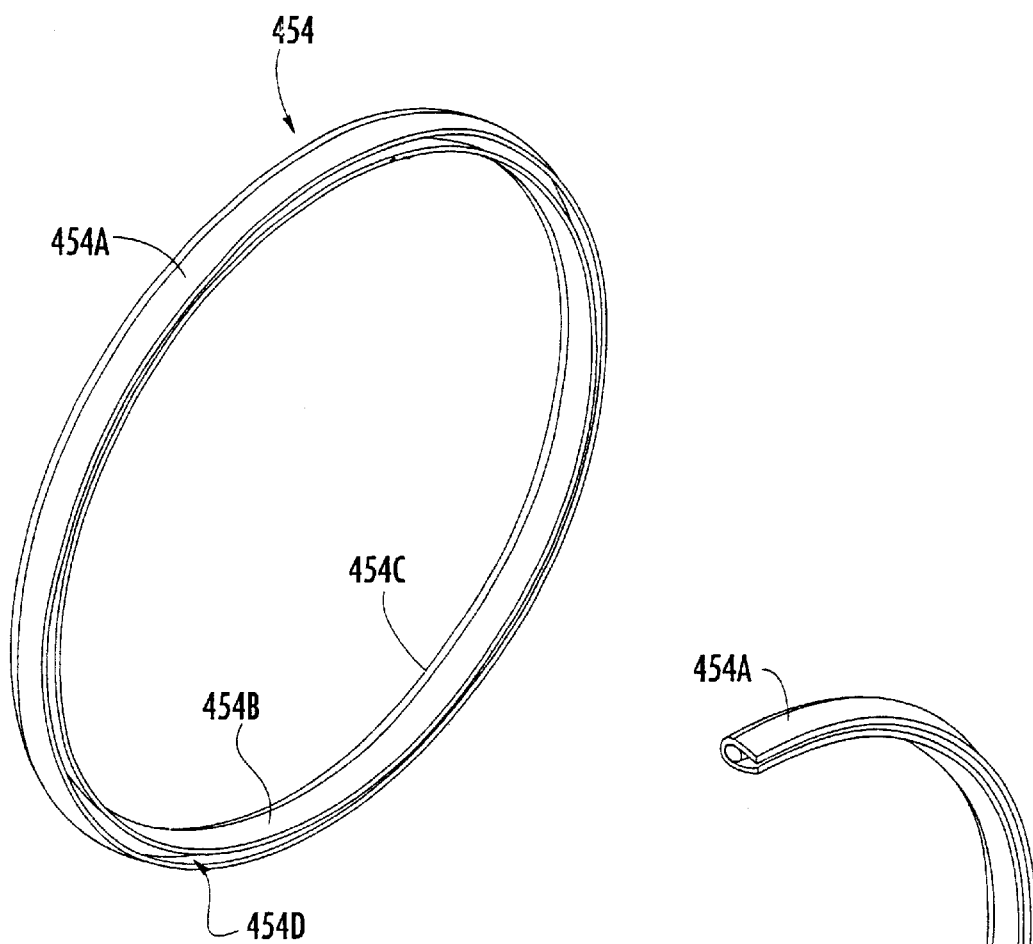
FIG. 16 is a perspective view of a cup seal forming a part of the pressure chamber assembly of FIG. 8.
Figure 17:
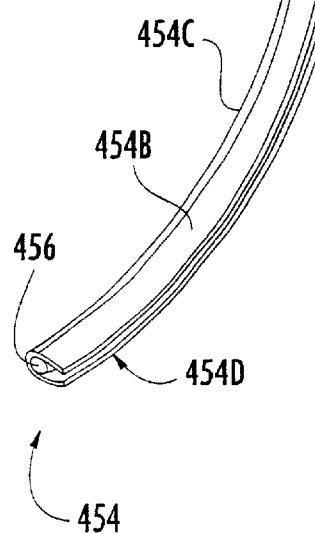
FIG. 17 is a fragmentary, perspective view of the cup seal of FIG. 16.

The cup seal 454 is shown in FIGS. 16 and 17. "Cup seal" as used herein means any self-energized seal that has a concave portion and is configured such that, when the concave portion of the seal is pressurized (e.g., by a pressurized chamber on the concave side of the seal), the seal is thereby internally pressurized and caused to exert an outward force (e.g., against adjacent surfaces of a pressure vessel defining the pressure chamber), to thereby form a seal. The cup seal 454 includes an annular inner wall 454B joined along an annular fold 454C to an annular outer wall 454A and defining an annular channel 454D therein.

The cup seal 454 is preferably unitarily formed of a flexible resilient material. Preferably, the cup seal 454 is formed of a material that is resistant to swelling and damage when exposed to dense $CO_2$. Suitable materials include fluorinated polymers and elastomers, such as PTFE (Teflon®, DuPont), filled PTFE, PTFE copolymers and analogs, such as FEP (fluorinated ethylene/propylene copolymers), Teflon AF, CTFE, other highly stable plastics, such as poly(ethylene), UHMWPE (ultra-high molecular weight poly(ethylene)), PP, PVC, acrylic polymers, amide polymers, and various elastomers, such as neoprene, Buna-N, and Epichlorohydrin-based elastomers. Suitable seal materials can be obtained from PSI Pressure Seals Inc., 310 Nutmeg Road South, South Windsor, Conn. 06074.

The cup seal 454 may be secured to the flange 424 by affixing at least one, and preferably both, of the inner wall 454B and the fold 454C to the adjacent portions of the flange 424 and/or the retaining ring 458. The inner wall 454B, 454C may be secured to the flange 424 using adhesive, for example. Preferably, the cup seal 454 is retained by the retaining ring 458 without the use of adhesive or the like.

The spring 456 may be any suitable spring capable of repeatedly and reliably biasing the outer wall 454A away from the inner wall 454B (i.e., radially outwardly). Preferably, the spring 456 biases the cup seal 454 radially outwardly beyond the flange 424 when the casings 420, 430 are separated (see FIG. 9). Preferably, the spring 456 is a wound wire spring or a cantilever type spring having a shape similar to, but smaller than, the cup seal 454 and nested inside the cup seal 454. The spring 456 is preferably formed of spring grade stainless steel. The spring 456 may be integrally formed with the cup seal 454. In addition to or in place of the provision of the spring 456, the cup seal 454 may be formed so as to have an inherent bias to spread the walls 454A, 454B apart. Moreover, the spring 456 may be omitted and the cup seal 454 may be provided with no inherent bias.

The O-ring 452 is disposed in the groove 435. Preferably, the O-ring 452 is secured in the groove 435 by an interference fit. The O-ring is formed of a deformable, resilient material. Preferably, the O-ring 452 is formed of an elastomeric material. More preferably, the O-ring 452 is formed of bunna-n or neoprene, and most preferably of EDPM. The O-ring 452 is sized such that, when the O-ring 452 is in its unloaded state (i.e., when the casings 420, 430 are separated; see FIG. 9), a portion of the O-ring 452 will extend above the abutment face 436.

When the casings 420, 430 are closed, the cup seal 454 is captured between the flanges 424 and 434 as shown in FIGS. 8 and 15. The spring 456 biases the walls 454A and 454B against the walls 434A and 425A, respectively. When the chamber 410 is pressurized above the ambient pressure, the pressure exerted in the channel 454D forces the walls 454A and 454B apart and into tighter, more sealing engagement with the respective walls 434A and 425A.

In this manner, the cup seal 454 provides a secure, primary seal that prevents or substantially reduces the flow of the fluid from the chamber 410 to the O-ring 452 along the fluid leak path 3. The O-ring 452 is thereby spared potentially damaging exposure to the process fluid. Such protection of the O-ring 452 may substantially extend the service life of the O-ring 452, particularly where the process fluid includes high pressure $CO_2$. Accordingly, the sealing system 450 may provide for a high throughput wafer manufacturing system with relatively long-lived seals.

Notably, when the chamber 410 is pressurized, the casings 420, 430 may be separated somewhat by the internal pressure so that the O-ring 452 is not well-loaded for sealing. Because the cup seal 454 serves as a primary seal, a secure sealing arrangement may nonetheless be provided. However, in the event of a partial or complete failure of the cup seal 454, the O-ring 452 may serve to prevent or reduce leakage of the process fluid to the environment. According to certain embodiments, the assembly 400 may be adapted such that the O-ring 452 will allow fluid to pass along the fluid leak path 3 when the chamber 410 is at at least a selected pressure so that the O-ring is not pressurized and no damaging process fluid (e.g., $CO_2$) is in contact with the O-ring for extended periods of time.

When the fluid in the chamber 410 is at atmospheric pressure or vacuum, the sealing effectiveness of the cup seal 454 will typically be diminished (however, the bias of the spring 456 may provide some sealing performance). In this event, the O-ring 452 may serve as the primary seal to prevent or reduce leakage of atmospheric fluid into the chamber 410 through the fluid leak path 3. Notably, the atmospheric fluid (typically air) typically will not include high concentrations of $CO_2$ or other components unduly harmful to the O-ring material.

Preferably, and as illustrated, the O-ring 452 sealing arrangement is a butt-type arrangement so that no sliding components are present. The pressure energizing mechanism of the cup seal 454 allows for use of a relatively low bias force for the spring 456. These aspects of the invention assist in minimizing the generation of any particles that may be detrimental to the wafer 5. The cup seal 454 may be otherwise oriented or located in the pressure chamber assembly. Two or more of the cup seals 454 may be arranged in series along the fluid leak path.

From the description herein, it will be appreciated that the combination of a cup seal and an elastomeric O-ring seal overcomes certain problems associated with high pressure sealing of $CO_2$ holding vessels that typically neither an elastomeric O-ring seal nor a cup seal can overcome. In particular, elastomeric O-rings are generally not long-lived when exposed to high-pressure $CO_2$ and then rapidly depressurized. Cup seals when used as pressure seals typically require a large pre-load spring to enable the same vessel for vacuum service. Such large pre-load may cause greater friction and wear and, thus, generation of damaging/contaminating particles. In accordance with the present invention, the elastomeric O-ring may be externally energized (compressed) when required to establish a vacuum within the chamber.

Wafer Holding Assembly

With reference to FIGS. 19–22, a wafer holding assembly 520 according to further embodiments of the present invention is shown therein. The assembly 520 may be used in place of the chuck 510 in a pressure chamber assembly 400B (FIG. 19) otherwise corresponding to the pressure chamber assembly 400. As will be better appreciated from the following description, the wafer holding assembly 520 includes a substrate holder or platen or chuck 522 and is adapted to retain the wafer on the chuck 522 by means of a pressure differential generated by rotation of the chuck 522.

Figure 19:
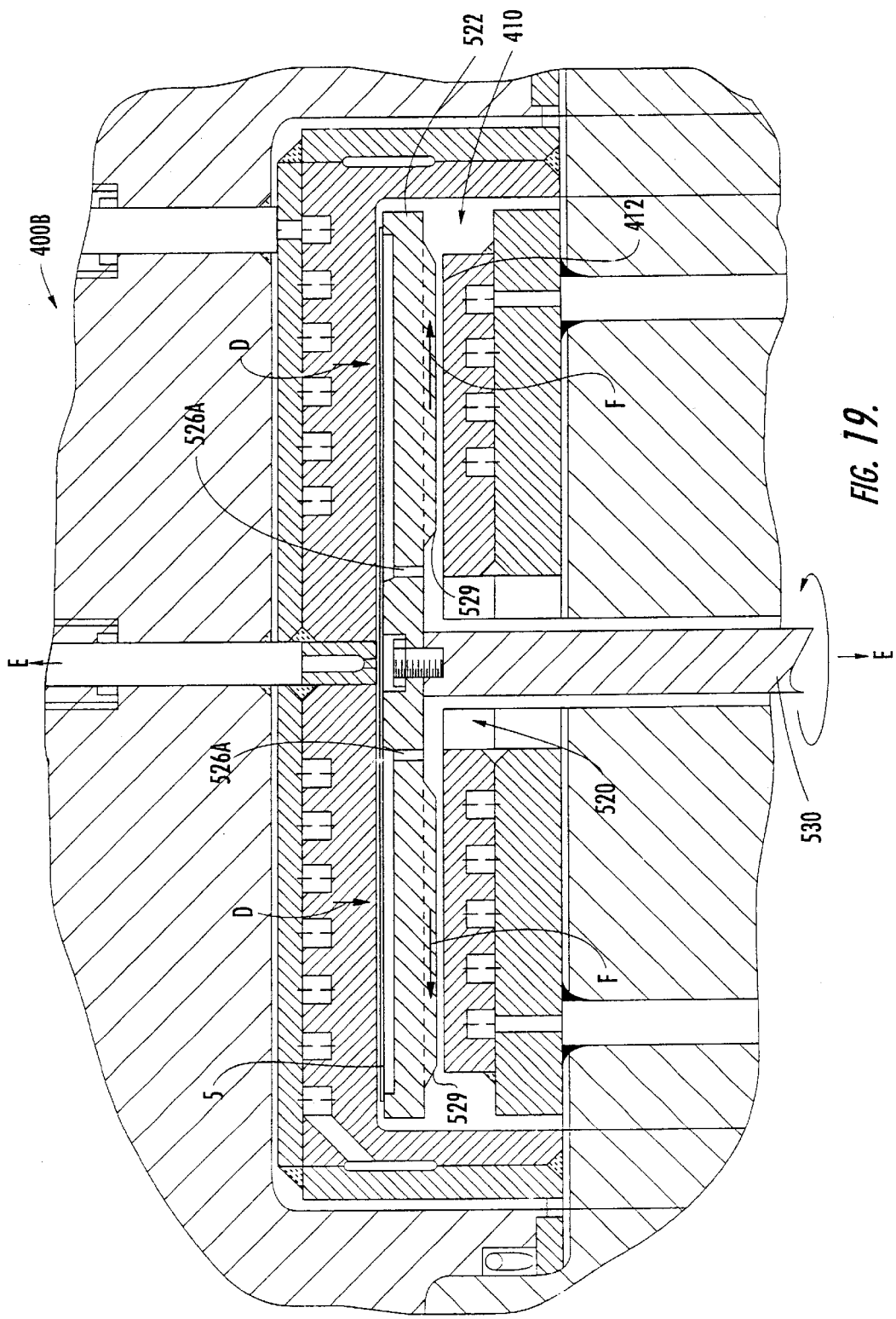
FIG. 19 is a cross-sectional view of a pressure chamber assembly according to further embodiments of the present invention.
Figure 20:
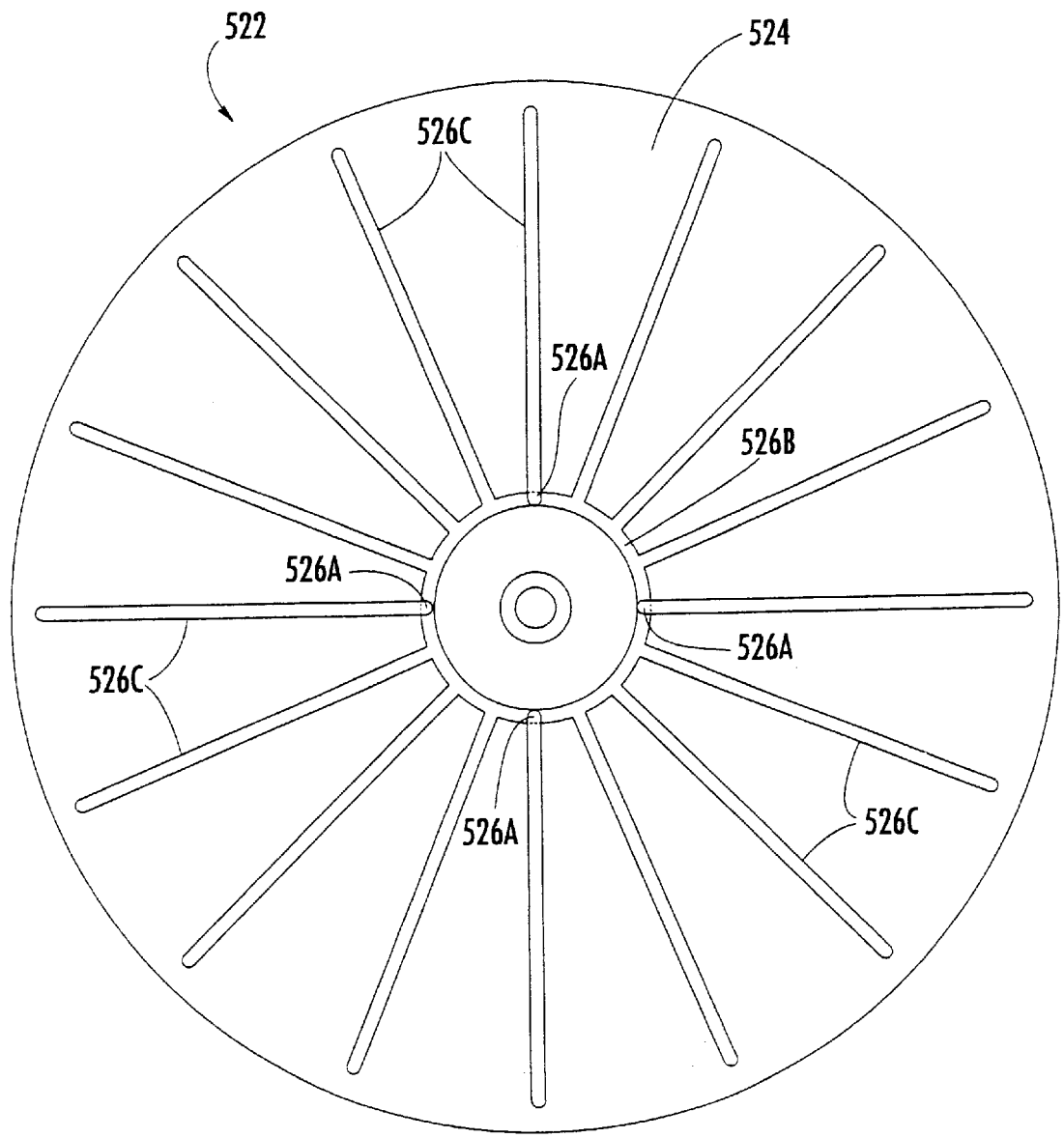
FIG. 20 is a top plan view of a chuck forming a part of the pressure chamber assembly of FIG. 19.
Figure 21:
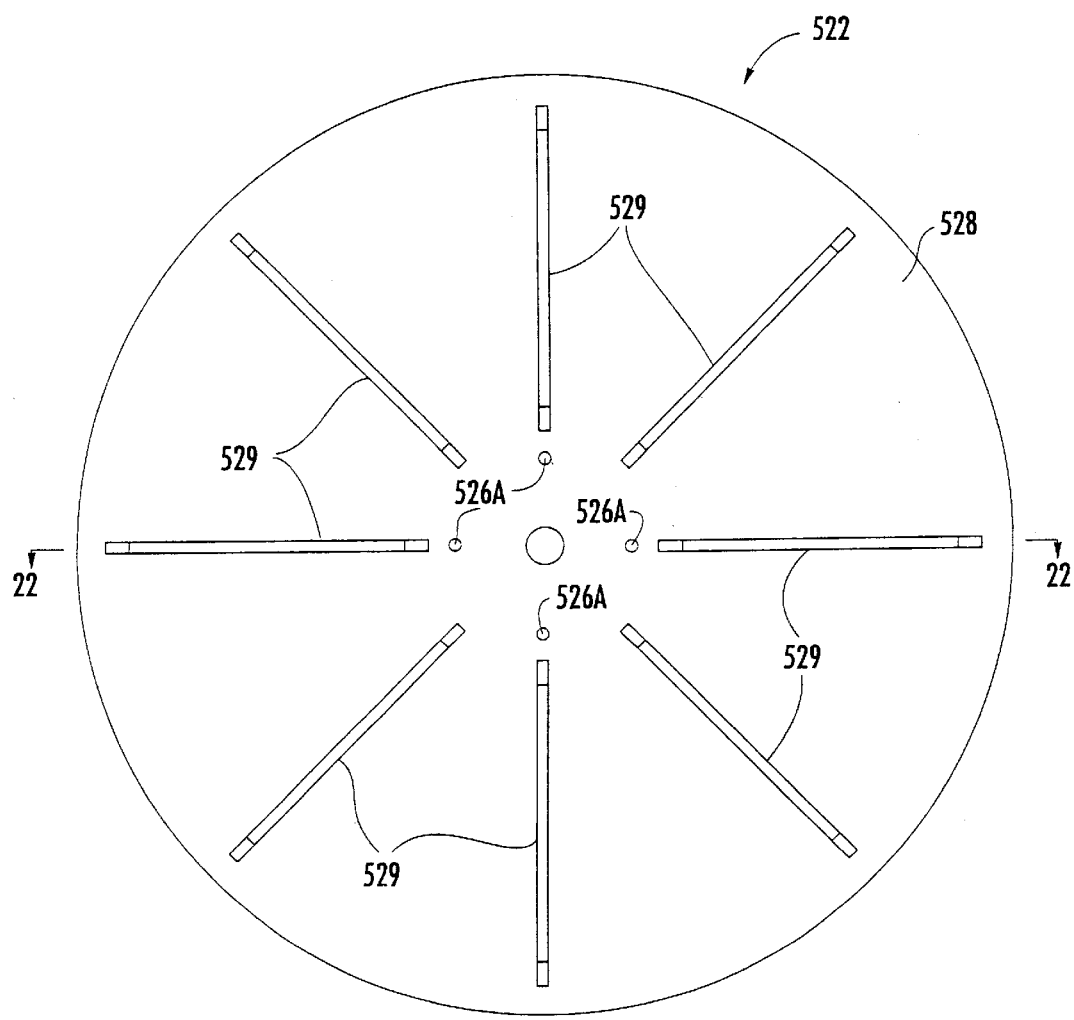
FIG. 21 is a bottom plan view of the chuck of FIG. 20.
Figure 22:
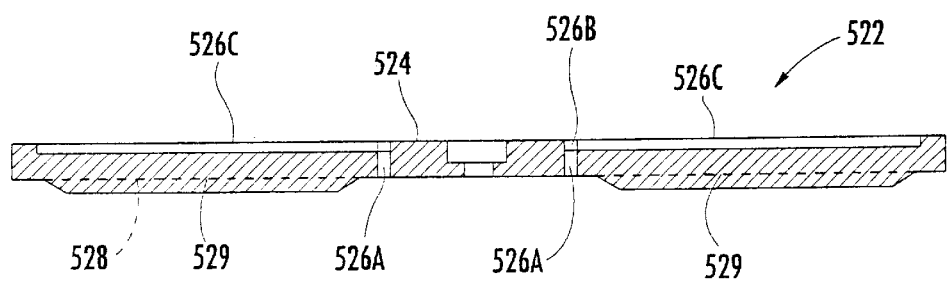
FIG. 22 is a cross-sectional view of the chuck of FIG. 20 taken along the line 22—22 in FIG. 21.

The chuck 522 has a front surface 524 and an opposing rear surface 528. A plurality (as shown, eight) of impeller vanes 529 extend rearwardly from the rear surface 528 and radially outwardly with respect to a central rotation axis E—E (FIG. 19). A plurality (as shown, four) of passages 526A extend fully through the chuck 522 from the rear surface 528 to a circumferential channel 526B formed in the front surface 524. A plurality (as shown, sixteen) of channels 526C extend radially outwardly from and fluidly communicate with the channel 526B. Additional circumferential channels (not shown) may fluidly connect the channels 526C.

As shown in FIG. 19, the chuck 522 is mounted on a driven shaft 530 for rotation therewith about the rotational axis E—E. As the chuck 522 is rotated, the impeller vanes 529 tend to push or force the fluid between the rear surface 528 and the adjacent, opposing surface 412 of the pressure chamber 410 radially outwardly in the directions F toward the outer periphery of the chuck 522. A pressure differential is thereby generated beneath the chuck 522 between the inner region (i.e., nearest the axis E—E) of the chuck 522 and the outer region of the chuck. More particularly, the pressure in the central region (including the pressure at the lower openings of the passages 526A) is less than the pressure at the outer edges of the chuck 522 and the pressure in the chamber 410 on the side of the wafer 5 opposite the chuck 522. As a result, a differential is created between the fluid pressure exerted on the top surface of the wafer 5 and the pressure of the fluid in the channels 526B, 526C.

In the foregoing manner, the wafer 5 is secured to the chuck 522 as the chuck 522 and the wafer 5 are rotated. In order to retain the wafer 5 on the chuck 522 prior to initiating rotation or during process steps without rotation, and/or in order to provide additional securement, supplemental holding means may be provided. Such supplemental means may include, for example, adhesive, clamps, and/or an externally generated pressure differential assembly such as the wafer holding assembly 550 described below.

Figure 24:
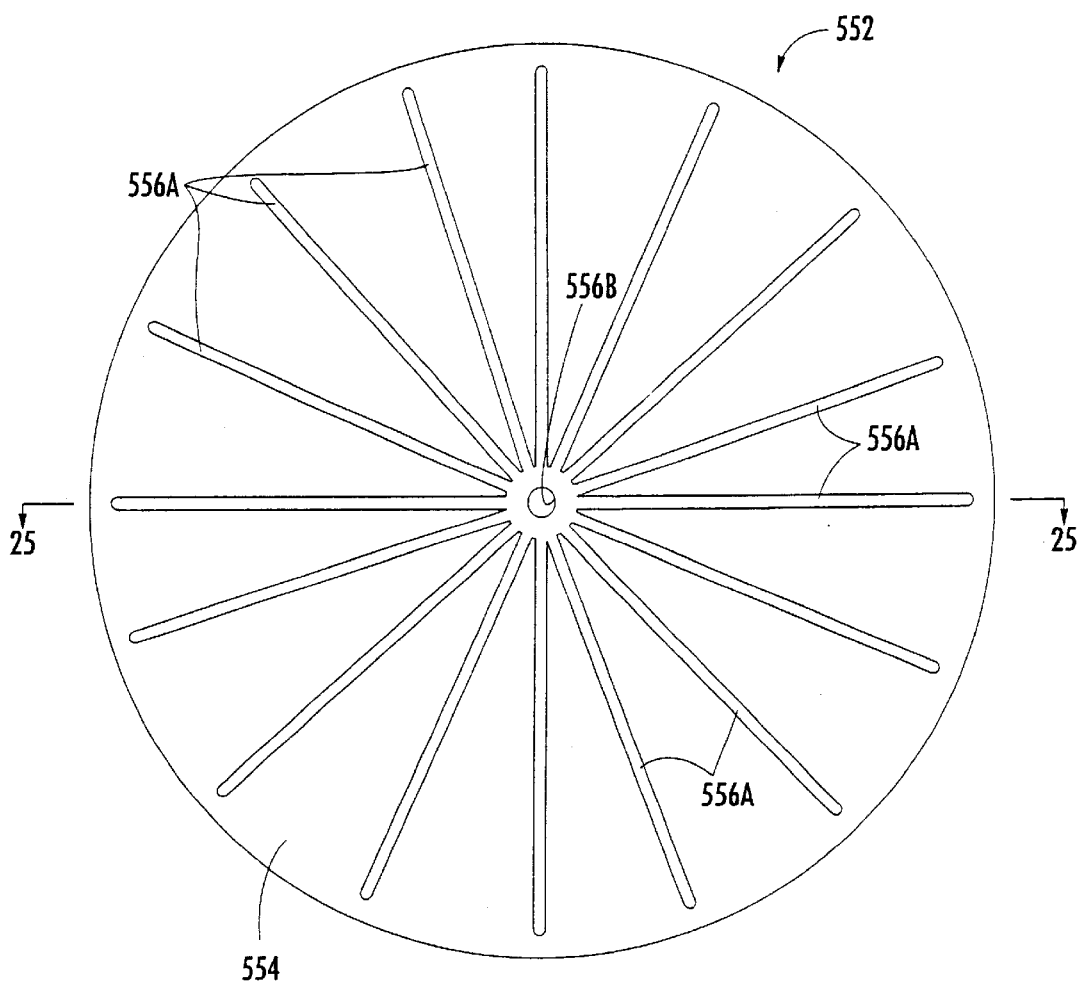
FIG. 24 is a top plan view of a chuck forming a part of the pressure chamber assembly of FIG. 23.
Figure 25:
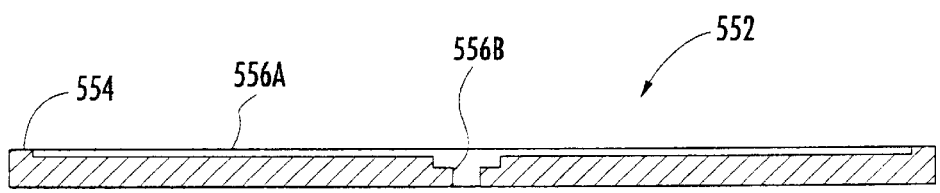
FIG. 25 is a cross-sectional view of the chuck of FIG. 24 taken along the line 25—25 of FIG. 24.

With reference to FIGS. 23–25, a wafer holding system 551 according to further embodiments of the present invention is shown therein. The system 551 includes a wafer holding assembly 550 and may be used in place of the chuck 510 in a pressure chamber assembly 400C (FIG. 23) otherwise corresponding to the pressure chamber assembly 400 (for clarity, certain elements of the assembly 400C are not shown). The assembly 400C is further provided with a magnetic drive assembly 580.

As will be better appreciated from the following description, the wafer holding assembly 550 includes a substrate holder or platen or chuck 552 and is adapted to retain the wafer 5 on the chuck 552 by means of a pressure differential between the pressure in the pressure chamber 410 and the pressure at an outlet 564. The magnetic drive system 580 is adapted to drive the chuck 552 relative to the pressure chamber 410 without requiring sealing directly between relatively moving elements (namely, a shaft 560 and the casing 430). It will be appreciated that the wafer holding system 551 may be used with other drive arrangements and that the magnetic drive assembly 580 may be used with other wafer holder mechanisms.

Turning to the magnetic drive assembly 580 in greater detail, the assembly 580 includes an upper housing 585 and a lower housing 584. The upper end of the upper housing 585 is received in the casing 430 such that a gas-tight seal is provided therebetween (e.g., by means of a suitable sealing device such as a gasket). The shaft 560 extends through the housing 585 and is rotatably mounted thereon by upper and lower bearings 586 and 588. A seal 561 is positioned between the shaft 560 and the housing member 585. The seal 561 is preferably a non-contact seal. More preferably, the seal 561 is a gap seal (more preferably, defining a gap G having a width of between about 0.001 and 0.002 inch) or a labyrinth seal. The seal 561 may also be a lip seal or a mechanical seal.

An internal magnet holder 590 is mounted on the lower end of the shaft 560 for rotation therewith and has an inner magnet M1 mounted on an outer portion thereof. The internal magnet carrier 590 is disposed in the lower housing member 584. A pressure cap 596 surrounds the internal magnet carrier 590 and forms a gas-tight seal (e.g., by means of a suitable sealing device such as a gasket) with the lower end of the lower housing member 584. In this manner, the pressure cap 596 and the upper housing member 585 together form a gas-tight reservoir for fluids that may enter the upper housing member 585 from the pressure chamber 410.

A drive unit 582 is mounted on the housing member 584. The drive unit 582 may be any suitable drive device such as a hydraulically driven unit or, more preferably, an electrically driven unit. The drive unit 582 is operable to rotate a shaft 594 that extends into the housing member 584. An external magnet holder 592 is mounted on the shaft 594 for rotation therewith. The external magnet holder 592 is disposed in the housing member 584, but is mechanically and fluidly separated from the internal magnet holder 590 and the pressure chamber 410 by the pressure cap 596. An external magnet M2 is mounted on the external magnet holder 592 for rotation therewith.

The magnets M1 and M2 are relatively constructed, arranged and configured to such that they are magnetically coupled to one another. In this manner, the magnets M1, M2 serve to indirectly mechanically couple the external magnet holder 592 and the internal magnet holder 590, and thereby the shaft 594 and the shaft 560. Thus, the chuck 522 may be rotated by operation of the drive unit 582.

The magnetic drive assembly 580 may be any suitable drive assembly with suitable modifications as described herein. Suitable magnetic drive assemblies include the BMD 150, available from Butchi AG of Uster, Switzerland. Moreover, other types of non-mechanically coupling drive units may be used.

As best seen in FIGS. 24 and 25, the chuck 552 has a front surface 554. A countersunk passage 556B extends fully through the chuck 552. A plurality of channels 526A extend radially outwardly from and fluidly communicate with the passage 556B. Additional circumferential channels (not shown) may fluidly connect the channels 526A.

As shown in FIG. 23, the chuck 552 is mounted on the driven shaft 560 by a nut 558 for rotation with the shaft 560 about a rotational axis F—F. The shaft 560 has an axially extending connecting passage 562 extending therethrough. The nut 558 has a central aperture that allows fluid communication between the passage 562 and the passage 556B. A passage 563 extends radially through the shaft 560 and fluidly connects the passage 562 to the secondary chamber 565 defined between the housing 585 and the shaft 560. Preferably, the seal 561 is a non-contact seal (e.g., a gap seal or a labyrinth seal) forming a restricted flow passage that provides fluid communication between the pressure chamber 410 and the secondary chamber 565.

An outlet 564 in the housing member 585 fluidly connects the secondary chamber 565 with a line L40. A line L41 having a valve V30 fluidly connects a flow restrictor 566 and a storage tank 568 to the line L40. The flow restrictor 566 may be a throttling orifice or a suitable partial closure valve such as a needle valve adapted to provide a controlled limit on flow therethrough. A line L42 having a valve V31 fluidly connects a fluid transfer device P20 (e.g., a vacuum pump) to the line L40.

The system 551 may be used in the following manner to secure the wafer 5 to the chuck 552. A pressure is provided in the storage tank 568 that is less than the pressure of the atmosphere in the pressure chamber 410 under typical process conditions. During processing, the valve V30 is opened so that the secondary chamber 565 is placed in fluid communication with the storage tank 568 which serves as a passive low pressure source (i.e., no pump, compressor or the like is employed to generate the pressure or vacuum). In this manner, the pressure in the chamber 565 (and, therefore, in the fluidly communicating channels 556A) is less than the pressure in the pressure chamber 410. A pressure differential is thereby generated between the upper surface of the wafer 5 and the backside of the wafer 5, causing the wafer 5 to be drawn down onto the chuck 552 in the direction D.

The flow restrictor 566 serves to limit flow of fluid from the secondary chamber 565 to the storage tank 568, thereby providing a controlled leak. The controlled leak serves to ensure a that sufficient differential pressure is provided across the wafer 5 to hold it in place without allowing undue loss of the fluid from the pressure chamber 410.

Preferably, the pressure of the storage tank 568 is greater than atmospheric pressure, but less than the pressure of the pressure chamber 410 during the intended processes. The storage tank 568 may permit gas that is drawn from the pressure chamber 410 to be cleaned and recycled or otherwise disposed of.

Alternatively, the storage tank 568 may be omitted or bypassed such that the line L41 vents directly to atmosphere when the valve V30 is opened.

If the pressure of the atmosphere in the pressure chamber 410 is the same as or less than the pressure of the passive low pressure source (i.e., the storage tank 568 or the ambient atmosphere), the fluid transfer device P20 may be operated to reduce the pressure in the chamber 565 to less than the pressure in the pressure chamber 410 to generate the desired amount of pressure differential across the wafer 5. In this event, the valve V30 is closed and the valve V31 is opened.

Preferably, the system 551 is operable to generate a pressure in the channels 556A that is at least 1 psi less than the pressure in the pressure chamber 410, and more preferably, between about 5 and 20 psi less.

Rotating Spray Member

The spray member 190 as described above as well as the spray members 602, 652 described below provide dispersed inlets to deliver process fluids directly to the surface of the wafer. Moreover, the spray members provide a distributed stream of these fluids that incorporates mechanical action from the fluid/surface impingement. This mechanical action is generally the result of the momentum of the fluid stream coming out of the spray member.

Design of the spray member (including, for example, number, spacing and sizes of spray ports) may be used to selectively control the use of the energy transfer/mechanical action. Additionally, simultaneous rotation of the wafer may serve to generate shear (momentum) between the fluid and the wafer surface to further facilitate removal of materials from the surface.

Figure 26:
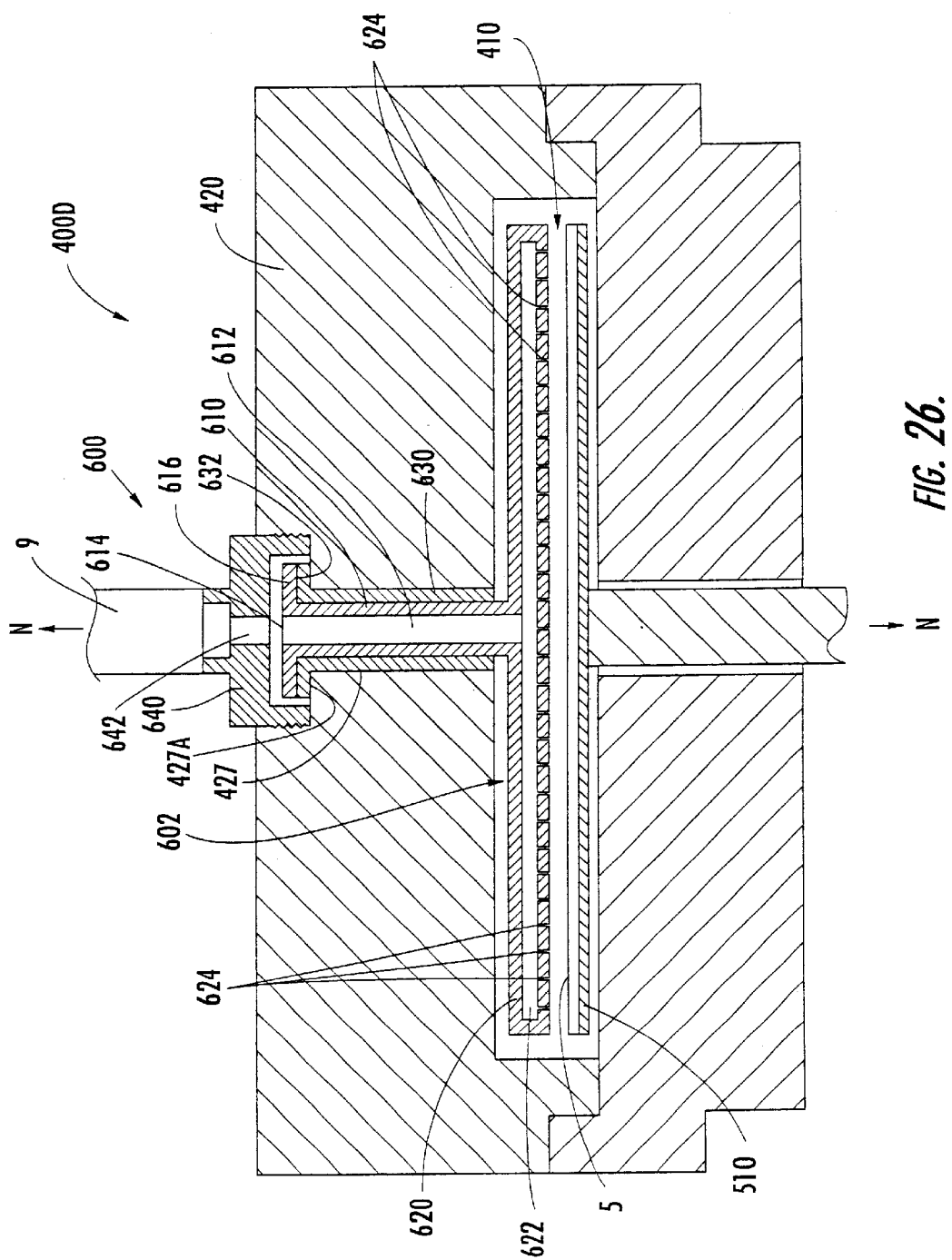
FIG. 26 is a cross-sectional view of a pressure chamber assembly according to further embodiments of the present invention.

With reference to FIG. 26, a pressure chamber assembly 400D according to further embodiments of the present invention is shown therein. The assembly 400D may be the same as the assembly 400 (certain aspects not shown in FIG. 26 for clarity), for example, except for the provision of a rotating spray member assembly 600. The assembly 400D may include a rotatively driven wafer holder 510 or the wafer 5 may be held stationary. The spray member assembly 600 may be used with any of the above-described pressure chamber assemblies. Notably, the spray member assembly 600 may be used to provide relative rotation between a spray member and a wafer without requiring a rotating wafer holder.

Figure 27:
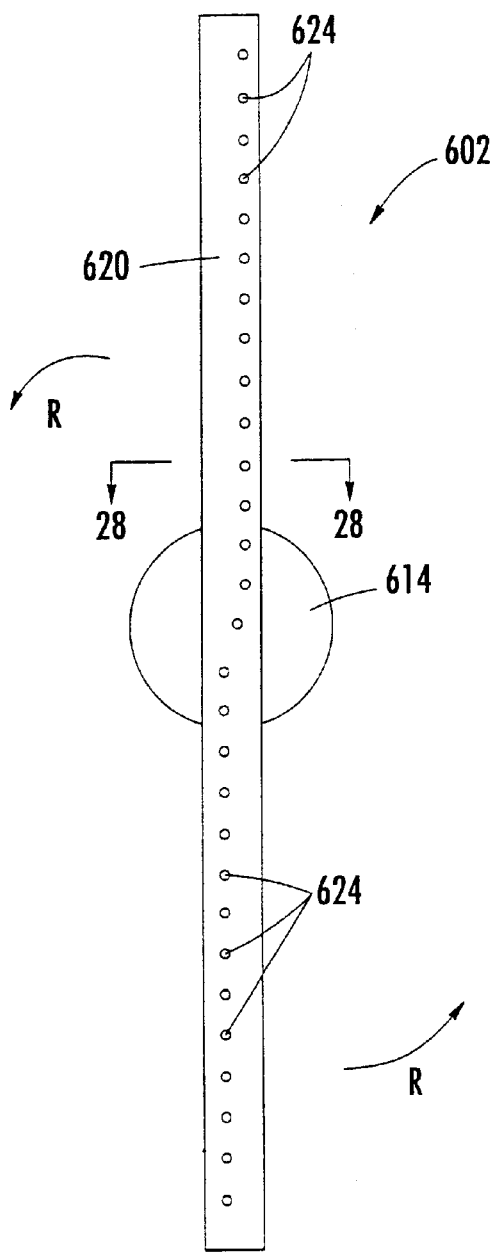
FIG. 27 is a bottom view of a spray member forming a part of the pressure chamber assembly of FIG. 26.
Figure 28:
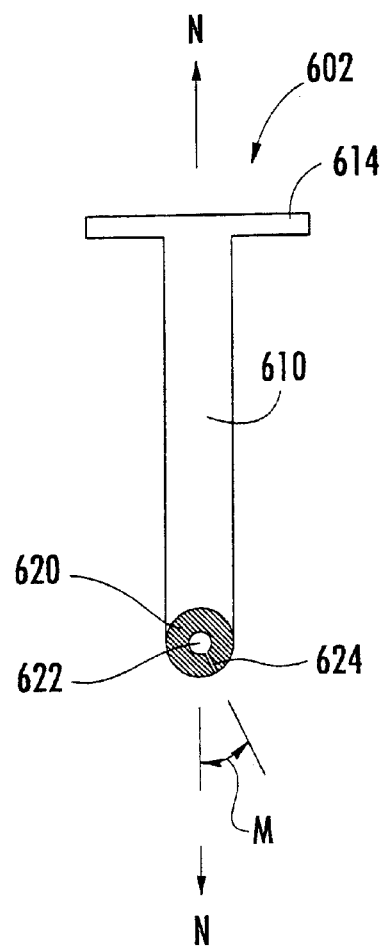
FIG. 28 is a cross-sectional view of the spray member of FIG. 27 taken along the line 28—28 of FIG. 27.
Figure 29:
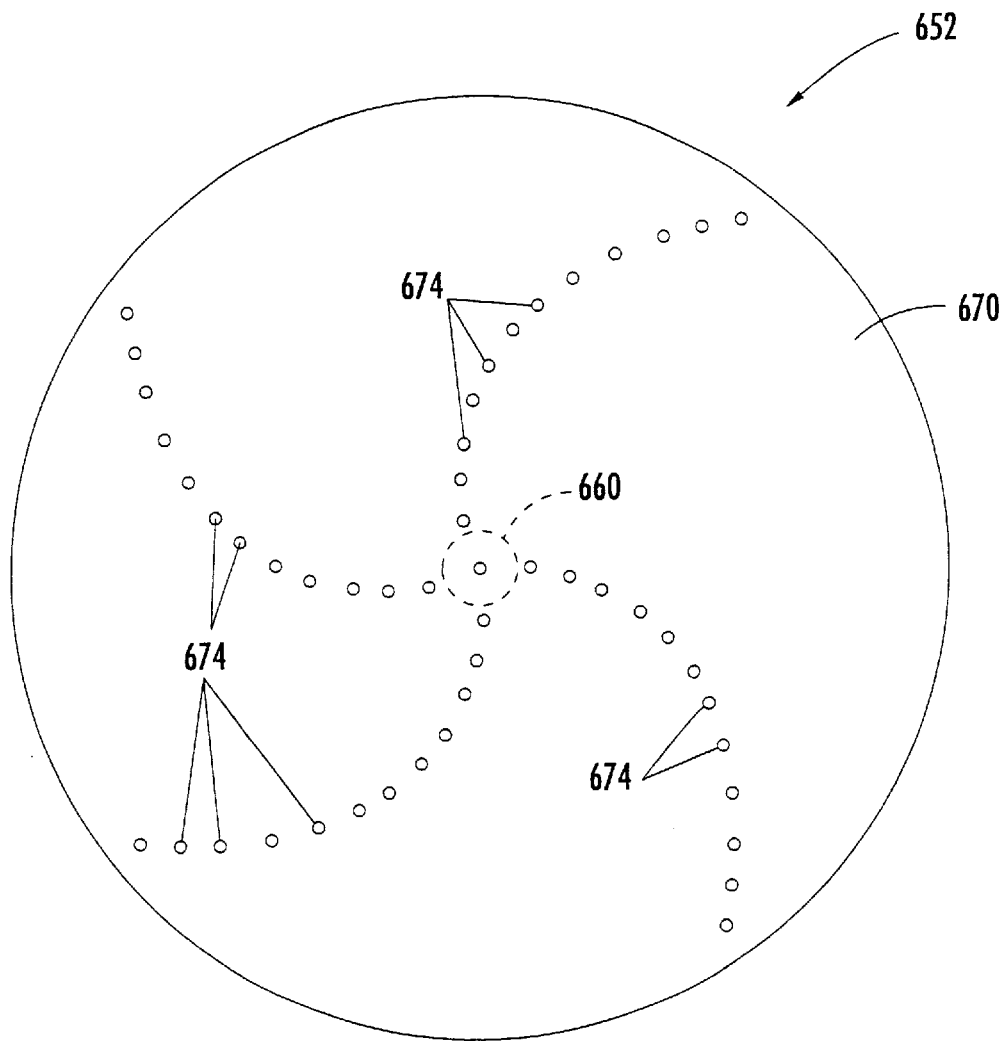
FIG. 29 is a bottom plan view of a spray member according to further embodiments of the present invention.

The spray member assembly 600 includes a spray member 602 as also shown in FIGS. 27 and 28. The spray member 602 includes a shaft portion 610 and bar-shaped distribution portion 620. An axial passage 612 extends from an upper opening 614 and through the portion 610 and fluidly communicates with a lateral passage 622 in the portion 620. A series of spray ports 624 extend from the passage 622 to the lower, outer edge of the distribution portion 620. The spray member 602 may be formed of a highly oxidatively stable material such as 316 stainless steel.

A bearing 630 is fixed within a passage 427 in the casing 420 such that a flange 632 of the bearing 630 is received in an enlarged portion 427A of the passage 427. The bearing 630 is preferably a sleeve bearing as shown. The bearing 630 may be formed of PTFE, PE or PEEK. Preferably, the bearing 630 is formed of PTFE.

The shaft portion 612 extends through the bearing 630 and has a flange 616 overlying the flange 632. An end cap 640 is securely mounted to the casing 420 in the portion 427A and over the flange 616, for example, by threading. Preferably, the end cap 640 forms a gas pressure tight seal with the casing 420.

The end cap 640 is adapted to receive a supply of process fluid (e.g., from a supply line 9) such that the flow of process fluid is directed through a passage 642 and into the passage 612. The fluid continues into the passage 622 and is dispensed through the ports 624.

With reference to FIGS. 27 and 28, the ports 624 are angled with respect to the intended rotational axis N—N (see FIG. 28) of the spray member 602. Preferably, the ports 624 are disposed at an angle M (FIG. 28) of between about 0 and 85 degrees, and more preferably of between about 30 and 60 degrees. The ports 624 are angled opposite the direction R (FIG. 27) of intended rotation.

In use, the reaction force responsive the fluid exiting the ports 624 (i.e., the hydraulic propulsion) causes the spray member 602 to rotate about the axis N—N within the bearing 630. Notably, because the bearing 630 is mounted internally (i.e., within the high pressure region) of the pressure chamber 410 separated from ambient pressure by the end cap 640, the bearing is not subjected to loading from a substantial pressure drop thereacross.

Alternatively or in addition to the hydraulically driven rotation, the spray member 602 may be coupled to a drive unit. The spray member may be directly or indirectly mechanically coupled to the drive unit (e.g., using a bearing/seal/drive unit configuration) or may be non-mechanically coupled (e.g., using a coupling force for electromagnetic or magnetic (permanent, electro- or induction-driven) coupling). Some or all of the ports 624 may be oriented parallel to the axis of rotation N—N.

A spray member 652 according to further embodiments of the present invention may be used in place of the spray member 602 and with any of the foregoing modifications or features. The spray member 652 has a shaft portion 660 and corresponds to the spray member 602 except that the bar-shaped distribution portion 620 is replaced with a plate- or disk-shaped distribution portion 670 having a pattern of spray ports 674 formed therein. The pattern of the spray ports 674 may be modified.

It will be appreciated that various of the inventions described hereinabove and as reflected in the claims that follow may be used for processes other than those specifically discussed above with regard to the preferred embodiments. For example, the means and methods for holding a wafer to a chuck may be employed to hold other types of substrates, in other types of processes (e.g., processes not involving $CO_2$ or wafer fabrication). The supply/recovery system 300 and the subsystems thereof may be used in other systems and processes using $CO_2$-containing process fluids, such as chemical mechanical planarization (CMP) systems employing $CO_2$.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed That which is claimed is:

1. A pressure chamber assembly for processing a substrate, the pressure chamber assembly comprising:
   a) a pressure vessel defining an enclosed pressure chamber;
   b) a substrate holder disposed in the pressure chamber and adapted to hold the substrate;
   c) a drive assembly operable to move the substrate holder, the drive assembly including:
      a first drive member connected to the substrate holder for movement therewith relative to the pressure vessel;
      a second drive member fluidly isolated from the first drive member and the pressure chamber; and
      a drive unit operable to move the second drive member, wherein the drive unit is fluidly isolated from the first drive member and the pressure chamber;
      wherein the second drive member is non-mechanically coupled to the first drive member such that the drive unit can move the substrate holder via the first and second drive members; and
   d) means for providing a pressurized fluid in the pressure chamber such that the pressurized fluid pressurized to a pressure greater than ambient atmospheric pressure.

2. The pressure chamber assembly of claim 1 wherein the second drive member is magnetically coupled to the first drive member.

3. The pressure chamber assembly of claim 2 including:
   a first magnet mounted on the first drive member;
   a second magnet mounted on the second drive member adjacent and spaced apart from the first magnet; and
   a housing interposed between the first and second magnets such that the first and second magnets are mutually fluidly isolated thereby.

4. The pressure chamber assembly of claim 1 wherein:
   the drive assembly includes a housing forming a fluid-tight seal with the pressure vessel and defining a secondary chamber in fluid communication with the pressure chamber; and
   the first drive member is disposed within the secondary chamber and the second drive member is disposed outside the secondary chamber.

5. The pressure chamber assembly of claim 4 wherein the first drive member includes a shaft connected to the substrate holder and the drive assembly further includes a bearing interposed between the shaft and the housing.

6. The pressure chamber assembly of claim 1 wherein the drive assembly is operable to rotate the substrate holder relative to the pressure vessel.

7. The pressure chamber assembly of claim 1 wherein the means for providing the pressurized fluid includes a supply of $CO_2$ fluid.

8. The pressure chamber assembly of claim 7 wherein the supply of $CO_2$ fluid is includes dense phase $CO_2$.

9. The pressure chamber assembly of claim 8 wherein the supply of $CO_2$ fluid is includes liquid $CO_2$ and/or supercritical fluid $CO_2$.

10. The pressure chamber assembly of claim 9 wherein the means for providing the pressurized fluid is adapted to provide the $CO_2$ fluid in the pressure chamber at a pressure of at least 400 psi.

11. The pressure chamber assembly of claim 10 wherein the means for providing the pressurized fluid is adapted to provide the $CO_2$ fluid in the pressure chamber at a pressure of between about 800 psi and 3000 psi.

12. The pressure chamber assembly of claim 1 wherein the means for providing the pressurized fluid includes a tank containing a supply of pressurized fluid, the tank being fluidly connected to the pressure chamber.

13. The pressure chamber assembly of claim 12 wherein the means for providing a pressurized fluid includes a pump.

14. A pressure chamber assembly for processing a substrate, the pressure chamber assembly comprising:
   a) a pressure vessel defining an enclosed pressure chamber;
   b) a substrate holder disposed in the pressure chamber and adapted to hold the substrate;
   c) a magnetic drive assembly operable to move the substrate holder relative to the pressure vessel; and
   d) means for providing a pressurized fluid in the pressure chamber such that the pressurized fluid is pressurized to a pressure greater than ambient atmospheric pressure.

15. The pressure chamber assembly of claim 14 wherein the means for providing the pressurized fluid includes $CO_2$ fluid.

16. The pressure chamber assembly of claim 15 wherein the supply of $CO_2$ fluid includes dense phase $CO_2$.

17. The pressure chamber assembly of claim 16 wherein the supply of $CO_2$ fluid includes liquid $CO_2$ and/or supercritical fluid $CO_2$.

18. The pressure chamber assembly of claim 15 wherein the means for providing the pressurized fluid is adapted to provide the $CO_2$ fluid in the pressure chamber at a pressure of at least 400 psi.

19. The pressure chamber assembly of claim 18 wherein the means for providing the pressurized fluid is adapted to provide the $CO_2$ fluid in the pressure chamber at a pressure of between about 800 psi and 3000 psi.

20. The pressure chamber assembly of claim 14 wherein the means for providing the pressurized fluid includes a tank containing a supply of pressurized fluid, the tank being fluidly connected to the pressure chamber.

21. The pressure chamber assembly of claim 20 wherein the means for providing a pressurized fluid includes a pump.

22. A pressure chamber assembly for processing a substrate, the pressure chamber assembly comprising:
   a) a pressure vessel defining an enclosed pressure chamber and an exterior opening in fluid communication with the pressure chamber;
   b) a substrate holder disposed in the pressure chamber and adapted to hold the substrate;
   c) a drive assembly operable to non-mechanically move the substrate holder relative to the pressure vessel, the drive assembly including a housing covering the exterior opening of the pressure chamber so as to seal the exterior opening; and
   d) means for providing a pressurized fluid in the pressure chamber such that the pressurized fluid pressurized to a pressure greater than ambient atmospheric pressure.

23. The pressure chamber assembly of claim 22 wherein the drive assembly includes a drive member extending through the exterior opening and connected to the substrate holder.

24. The pressure chamber assembly of claim 22 wherein the means for providing the pressurized fluid includes a supply of $CO_2$ fluid.

25. The pressure chamber assembly of claim 24 wherein the supply of $CO_2$ fluid includes dense phase $CO_2$.

26. The pressure chamber assembly of claim 25 wherein the supply of $CO_2$ fluid is includes liquid $CO_2$ and/or supercritical fluid $CO_2$.

27. The pressure chamber assembly of claim 24 wherein the means for providing the pressurized fluid is adapted to provide the $CO_2$ fluid in the pressure chamber at a pressure of at least 400 psi.

28. The pressure chamber assembly of claim 27 wherein the means for providing the pressurized fluid is adapted to provide the $CO_2$ fluid in the pressure chamber at a pressure of between about 800 psi and 3000 psi.

29. The pressure chamber assembly of claim 22 wherein the means for providing the pressurized fluid includes a tank containing a supply of pressurized fluid, the tank being fluidly connected to the pressure chamber.

30. The pressure chamber assembly of claim 29 wherein the means for providing a pressurized fluid includes a pump.

31. A pressure chamber assembly for processing a substrate, the pressure chamber assembly comprising:
   a) a pressure vessel defining an enclosed pressure chamber;
   b) a substrate holder disposed in the pressure chamber and adapted to hold the substrate;
   c) a drive assembly operable to move the substrate holder, the drive assembly including:
      a first drive member connected to the substrate holder for movement therewith relative to the pressure vessel;
      a second drive member fluidly isolated from the first drive member and the pressure chamber; and
      a drive unit operable to move the second drive member, wherein the drive unit is fluidly isolated from the first drive member and the pressure chamber;
      wherein the second drive member is non-mechanically coupled to the first drive member such that the drive unit can move the substrate holder via the first and second drive members; and
   d) a supply of $CO_2$ fluid fluidly connected to the pressure chamber.

32. The pressure chamber assembly of claim 31 including a tank containing the supply of $CO_2$ fluid such that the supply of $CO_2$ fluid within the tank is maintained at a pressure greater than ambient atmospheric pressure.

33. The pressure chamber assembly of claim 32 wherein the supply of $CO_2$ fluid within the tank includes dense phase $CO_2$.

34. The pressure chamber assembly of claim 32 wherein the supply of $CO_2$ fluid within the tank is pressurized to a pressure of at least 400 psi.

35. A pressure chamber assembly for processing a substrate, the pressure chamber assembly comprising:
   a) a pressure vessel defining an enclosed pressure chamber;
   b) a substrate holder disposed in the pressure chamber and adapted to hold the substrate;
   c) a magnetic drive assembly operable to move the substrate holder relative to the pressure vessel; and
   d) a supply of $CO_2$ fluid fluidly connected to the pressure chamber.

36. The pressure chamber assembly of claim 35 including a tank containing the supply of $CO_2$ fluid such that the supply of $CO_2$ fluid within the tank is maintained at a pressure greater than ambient atmospheric pressure.

37. The pressure chamber assembly of claim 36 wherein the supply of $CO_2$ fluid within the tank includes dense phase $CO_2$.

38. The pressure chamber assembly of claim 36 wherein the supply of $CO_2$ fluid within the tank is pressurized to a pressure of at least 400 psi.

39. A pressure chamber assembly for processing a substrate, the pressure chamber assembly comprising:
   a) a pressure vessel defining an enclosed pressure chamber and an exterior opening in fluid communication with the pressure chamber;
   b) a substrate holder disposed in the pressure chamber and adapted to hold the substrate;
   c) a drive assembly operable to non-mechanically move the substrate holder relative to the pressure vessel, the drive assembly including a housing covering the exterior opening of the pressure chamber so as to seal the exterior opening; and
   d) a supply of $CO_2$ fluid fluidly connected to the pressure chamber.

40. The pressure chamber assembly of claim 39 including a tank containing the supply of $CO_2$ fluid such that the supply of $CO_2$ fluid within the tank is maintained at a pressure greater than ambient atmospheric pressure.

41. The pressure chamber assembly of claim 40 wherein the supply of $CO_2$ fluid within the tank includes dense phase $CO_2$.

42. The pressure chamber assembly of claim 40 wherein the supply of $CO_2$ fluid within the tank is pressurized to a pressure of at least 400 psi.

* * * * *

UNITED STATES PATENT AND TRADEMARK OFFICE
CERTIFICATE OF CORRECTION

PATENT NO. : 6,619,304 B2  Page 1 of 1
DATED : September 16, 2003
INVENTOR(S) : Steven Lee Worm It is certified that error appears in the above-identified patent and that said Letters Patent is hereby corrected as shown below:

<u>Column 31,</u>
Line 24, should read -- chamber such that the pressurized fluid is pressurized to --
Line 56, should read -- supply of $CO_2$ fluid includes dense phase $CO_2$. --
Line 60, should read -- The pressure chamber assembly of Claim 7 wherein --

<u>Column 32,</u>
Line 53, should read -- chamber such that the pressurized fluid is pressurized to --
Line 66, should read -- the supply of $CO_2$ fluid includes liquid $CO_2$ and/or --

Signed and Sealed this

Sixth Day of January, 2004

JAMES E. ROGAN
*Director of the United States Patent and Trademark Office*